United States Patent
Wu et al.

(10) Patent No.: US 10,763,273 B2
(45) Date of Patent: Sep. 1, 2020

(54) VERTICAL GAA FLASH MEMORY INCLUDING TWO-TRANSISTOR MEMORY CELLS

(71) Applicant: MACRONIX INTERNATIONAL CO., LTD., Hsinchu (TW)

(72) Inventors: Guan-Wei Wu, Renwu Township (TW); Yao-Wen Chang, Hsinchu (TW); I-Chen Yang, Changhua (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/110,897

(22) Filed: Aug. 23, 2018

(65) Prior Publication Data

US 2020/0066741 A1    Feb. 27, 2020

(51) Int. Cl.
| | | |
|---|---|---|
| H01L 27/11556 | (2017.01) | |
| H01L 27/11519 | (2017.01) | |
| H01L 27/11524 | (2017.01) | |
| H01L 27/11582 | (2017.01) | |
| H01L 27/1157 | (2017.01) | |
| G11C 16/10 | (2006.01) | |

(Continued)

(52) U.S. Cl.
CPC ........ H01L 27/11556 (2013.01); G11C 16/10 (2013.01); G11C 16/14 (2013.01); H01L 27/1157 (2013.01); H01L 27/11519 (2013.01); H01L 27/11524 (2013.01); H01L 27/11565 (2013.01); H01L 27/11582 (2013.01); G11C 16/26 (2013.01)

(58) Field of Classification Search
CPC ......... H01L 27/11556; H01L 27/11582; H01L 27/11524; H01L 27/11565; H01L 27/1157; H01L 27/11519; G11C 16/10; G11C 16/14
See application file for complete search history.

(56) References Cited

U.S. PATENT DOCUMENTS

| | | | |
|---|---|---|---|
| 9,620,217 B2 | 4/2017 | Lue et al. | |
| 2007/0252201 A1* | 11/2007 | Kito | ..................... H01L 21/8221 257/331 |

(Continued)

FOREIGN PATENT DOCUMENTS

| | | |
|---|---|---|
| TW | 201606777 A | 2/2016 |
| WO | 2016/053453 A1 | 4/2016 |

*Primary Examiner* — Thanh Y. Tran
(74) *Attorney, Agent, or Firm* — Haynes Beffel & Wolfeld LLP

(57) ABSTRACT

A memory device comprises an array of two-transistor memory cells, two-transistor memory cells in the array including a vertical select transistor and a vertical data storage transistor. The array comprises a plurality of stacks of conductive lines, a stack of conductive lines including a select gate line and a word line adjacent the select gate line. The device comprises an array of vertical channel lines disposed through the conductive lines to a reference line, gate dielectric structures surrounding the vertical channel lines at channel regions of vertical select transistors in the array of vertical channel lines and the select gate lines, charge storage structures surrounding the vertical channel lines at channel regions of vertical data storage transistors in the array of vertical channel lines and the word lines, and bit lines coupled to the vertical channel lines via upper ends of the vertical channel lines.

20 Claims, 17 Drawing Sheets

(51) Int. Cl.
*G11C 16/14* (2006.01)
*H01L 27/11565* (2017.01)
*G11C 16/26* (2006.01)

(56) References Cited

U.S. PATENT DOCUMENTS

| | | | |
|---|---|---|---|
| 2010/0207195 A1* | 8/2010 | Fukuzumi | G11C 16/0483 257/326 |
| 2010/0314678 A1* | 12/2010 | Lim | H01L 27/11578 257/324 |
| 2016/0071861 A1 | 3/2016 | Serov et al. | |
| 2016/0260732 A1 | 9/2016 | Lue | |

* cited by examiner

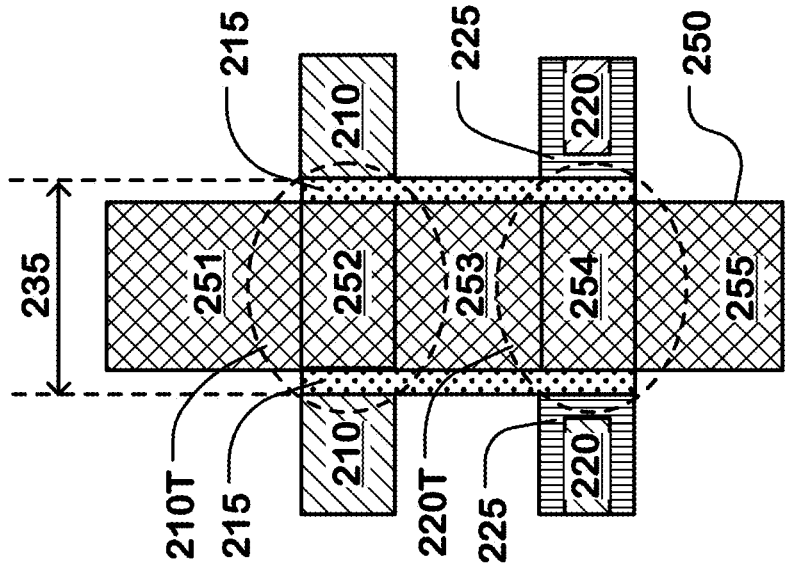
FIG. 2C    C-C' in FIG. 2
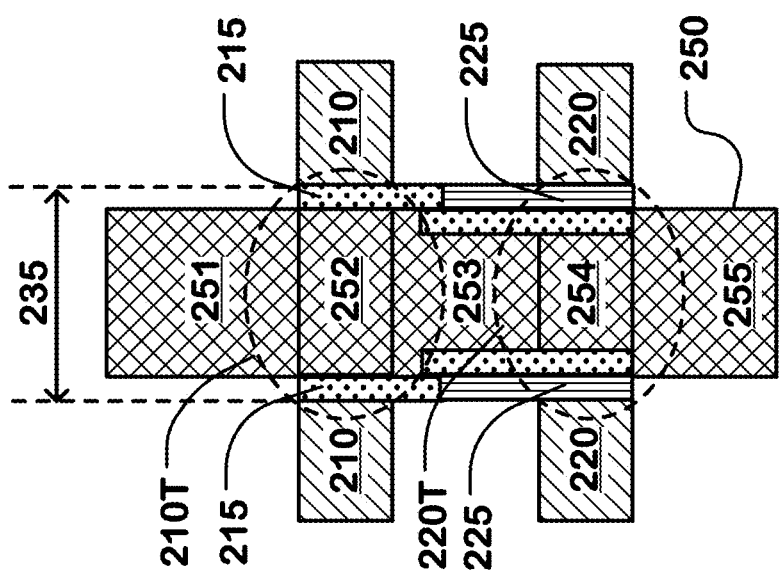
FIG. 2B    C-C' in FIG. 2

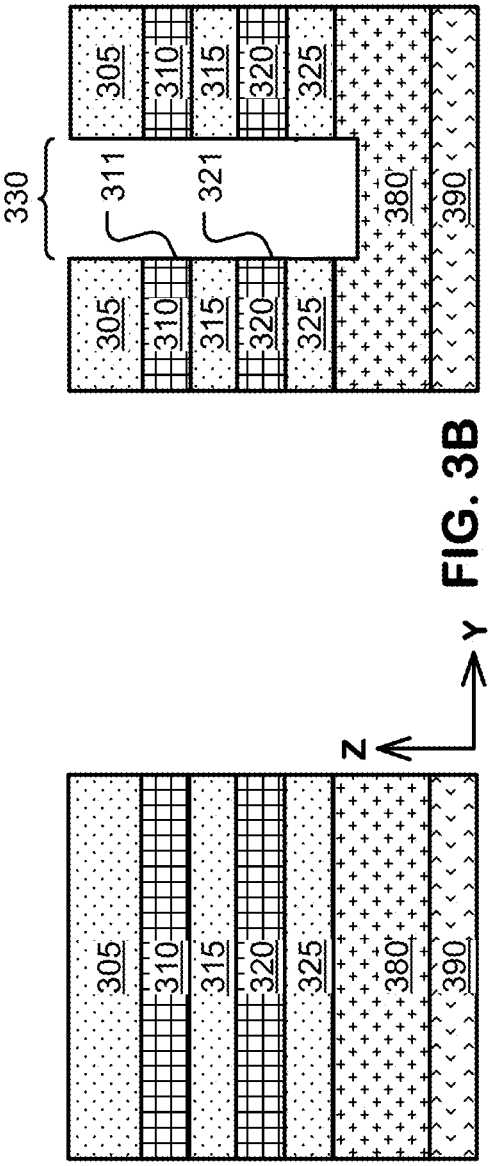
FIG. 3A
FIG. 3B
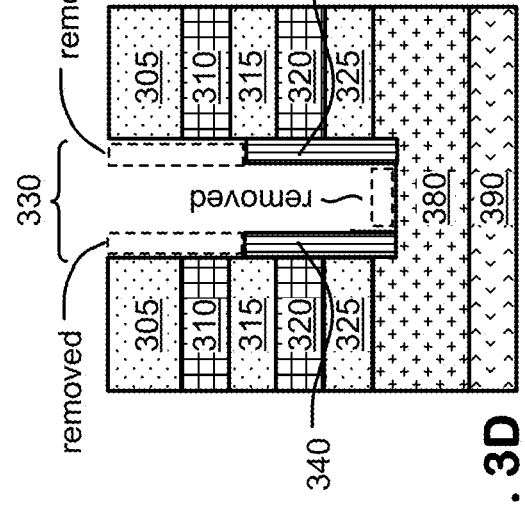
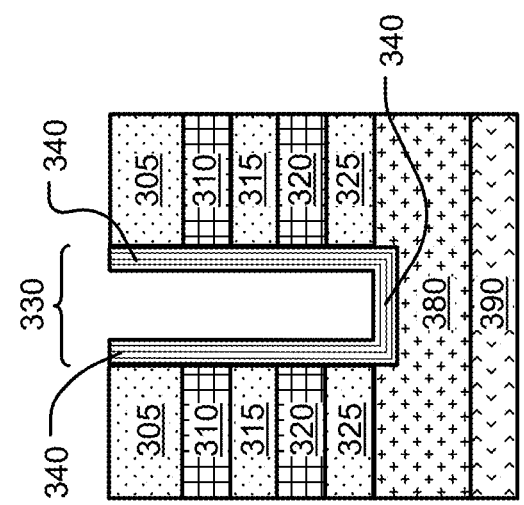
FIG. 3C
FIG. 3D

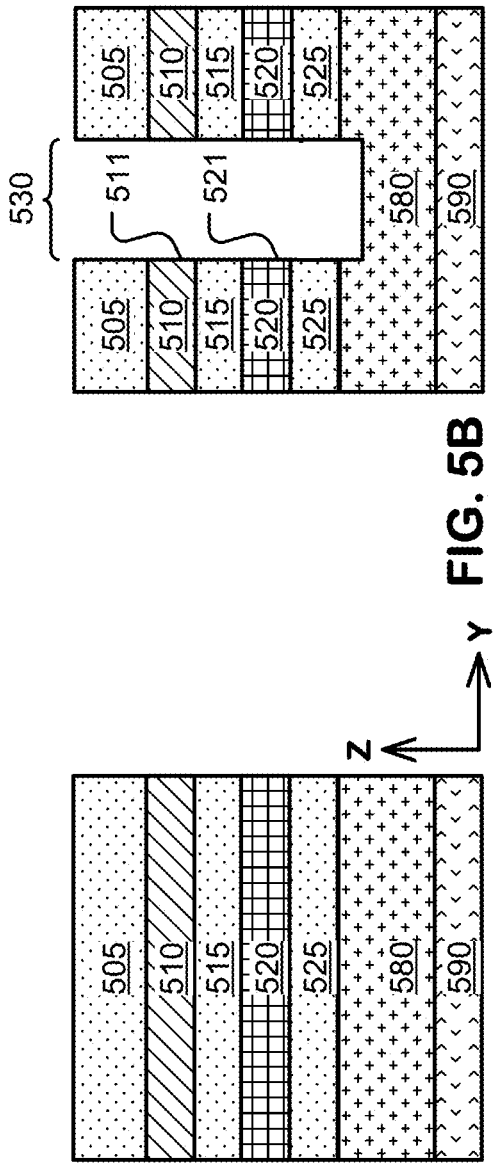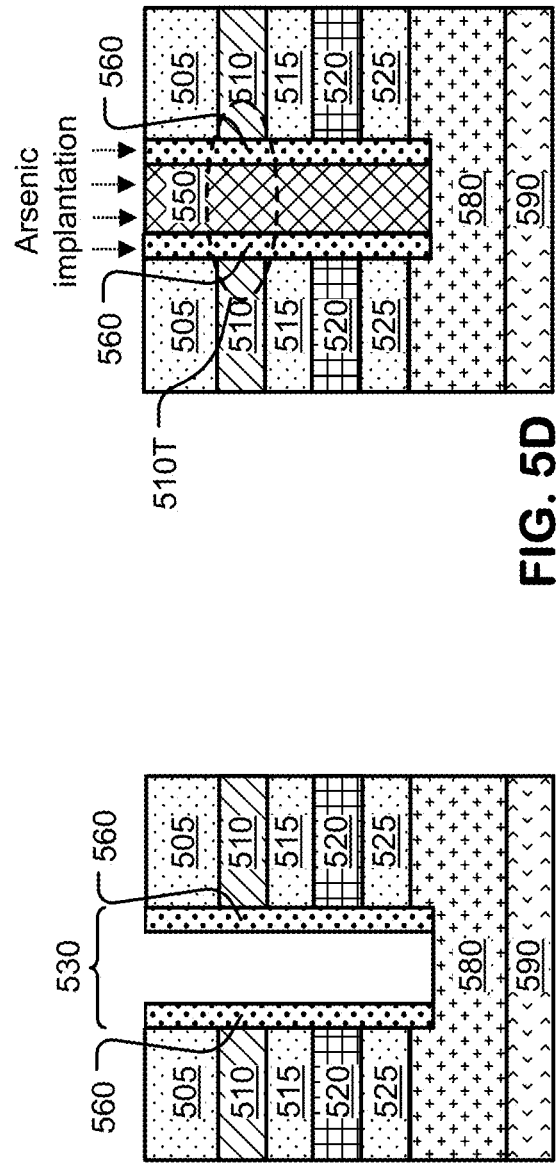
FIG. 5A
FIG. 5B
FIG. 5C
FIG. 5D

FIG. 7  Unit Cell = ( 0.8 * 0.16 ) / 4 = 0.032μm²

FIG. 8  Unit Cell = ( 0.55*0.12 ) / 2 = 0.033μm²

| Operation | | Bias Condition |
|---|---|---|
| Program | Select Gate Line | 1.5~2V |
| | Word Line | 3~7V |
| | Drain | 0V |
| | Source | 3~5V |
| Erase | Select Gate Line | FN: floating / BTB: floating |
| | Word Line | FN: 0V / BTB: -7V |
| | Drain | FN: floating / BTB: floating |
| | Source | FN: 15~18V / BTB: 0~4V |
| Read | Select Gate Line | 1.2V |
| | Word Line | 0~1V |
| | Drain | 0.5~1V |
| | Source | 0V |

FIG. 10

VERTICAL GAA FLASH MEMORY INCLUDING TWO-TRANSISTOR MEMORY CELLS

BACKGROUND

Field

The present invention relates to high density memory devices, and particularly to vertical channel memory devices having GAA (gate-all-around) structures.

Description of Related Art

As critical dimensions of devices in integrated circuits shrink to the limits of common memory cell technologies, designers have been looking to techniques for manufacturing memory cells that have smaller cell sizes and can be operated under lower bias voltages. For instance, a low cost 90 nm flash memory can have a cell size of 0.5184 $\mu m^2$, and a low cost 55 nm Flash memory can have a cell size of 0.2117 $\mu m^2$. A high performance 55 nm flash memory can have a cell size of 0.088 $\mu m^2$.

It is desirable to provide a structure for three-dimensional integrated circuit memory that have smaller cell sizes and can be operated under lower bias voltages.

SUMMARY

A vertical channel memory device comprises an array of two-transistor memory cells, two-transistor memory cells in the array including a vertical select transistor and a vertical data storage transistor. The array of two-transistor memory cells comprises a plurality of stacks of conductive lines separated by insulating layers on a substrate, a stack of conductive lines in the plurality of stacks including a select gate line and a word line adjacent the select gate line.

An array of vertical channel lines is disposed through the conductive lines in the plurality of stacks to a reference line. Gate dielectric structures surround the vertical channel lines at channel regions of vertical select transistors in the array of vertical channel lines and the select gate lines. Charge storage structures surround the vertical channel lines at channel regions of vertical data storage transistors in the array of vertical channel lines and the word lines. A plurality of bit lines overlying the array of vertical channel lines is coupled to the vertical channel lines via upper ends of the vertical channel lines.

Lower ends of the vertical channel lines are connected for current flow to the reference line. A reference line contact is disposed through the conductive lines to the reference line, the reference line contact electrically coupled via the reference line to the lower ends of the vertical channel lines. A single reference line contact can be electrically coupled via the reference line to the lower ends of multiple vertical channel lines.

In one embodiment, the array can include a set of cells arranged in a number X of columns and a number Y of rows of cells, the select gate line and the word line can each surround the cells in the set of cells, and the plurality of bit lines can include a number X times a number Y of bit lines coupled to respective vertical channel lines of the cells in the set of cells.

In an alternative embodiment, the array can include a set of cells arranged in a number X of columns and a number Y of rows of cells, the set of cells having a first subset of cells and a second subset of cells, the first and second subsets of cells each arranged in the number X of columns and the number Y/2 of rows of cells. The first-mentioned select gate line and the first-mentioned word line can each surround the cells in one of the first and second subsets of cells. A second select gate line and a second word line can each surround the cells in another of the first and second subsets of cells. The plurality of bit lines can include a number X times a number Y/2 of bit lines each coupled to a vertical channel line of a first cell in the first subset of cells and a vertical channel line of a second cell in the second subset of cells.

A controller in the memory device can be configured to execute a program operation on memory cells in the array of two-transistor memory cells by using channel hot electron injection, and to execute an erase operation on memory cells in the array of two-transistor memory cells by using channel hot hole injection.

A memory device comprises a two-transistor memory cell including a vertical select transistor having a first channel region in a vertical semiconductor pillar and a vertical data storage transistor having a second channel region in the vertical semiconductor pillar.

The vertical semiconductor pillar has a top region above the first channel region acting as a first current conducting terminal of the vertical select transistor, a bottom region below the second channel region acting as a second current conducting terminal of the vertical data storage transistor, and an intermediate region between the first channel region and the second channel region acting as a second current conducting terminal of the vertical select transistor and a first current conducting terminal of the vertical data storage transistor.

A bit line is coupled to the top region of the vertical semiconductor pillar. A reference line is coupled to the bottom region of the vertical semiconductor pillar.

A select gate line surrounds the first channel region in the vertical semiconductor pillar, and a gate dielectric structure is disposed between the select gate line and the first channel region in the vertical semiconductor pillar. A word line surrounds the second channel region in the vertical semiconductor pillar; and a charge storage structure is disposed between the word line and the second channel region in the vertical semiconductor pillar.

Methods of manufacturing a memory device as described herein are provided, where the memory device comprises an array of two-transistor memory cells, two-transistor memory cells in the array including a vertical select transistor and a vertical data storage transistor.

Other aspects and advantages of the present invention can be seen on review of the drawings, the detailed description and the claims, which follow.

BRIEF DESCRIPTION OF THE DRAWINGS

FIGS. 2A, 2B and 2C each illustrate a cross section of the two-transistor memory cell illustrated in FIG. 2 in accordance with embodiments.

FIGS. 3A through 3G illustrate an example process flow for manufacturing a two-transistor memory cell that includes a vertical select transistor and a vertical data storage transistor, in accordance with a first embodiment.

FIGS. 5A through 5G illustrate an example process flow for manufacturing a two-transistor memory cell that includes a vertical select transistor and a vertical data storage transistor, in accordance with a third embodiment.

FIG. 10 is a table illustrating example bias conditions for executing program, erase and read operations on two-transistor memory cells in accordance with the present technology.

DETAILED DESCRIPTION

Figure 1A:
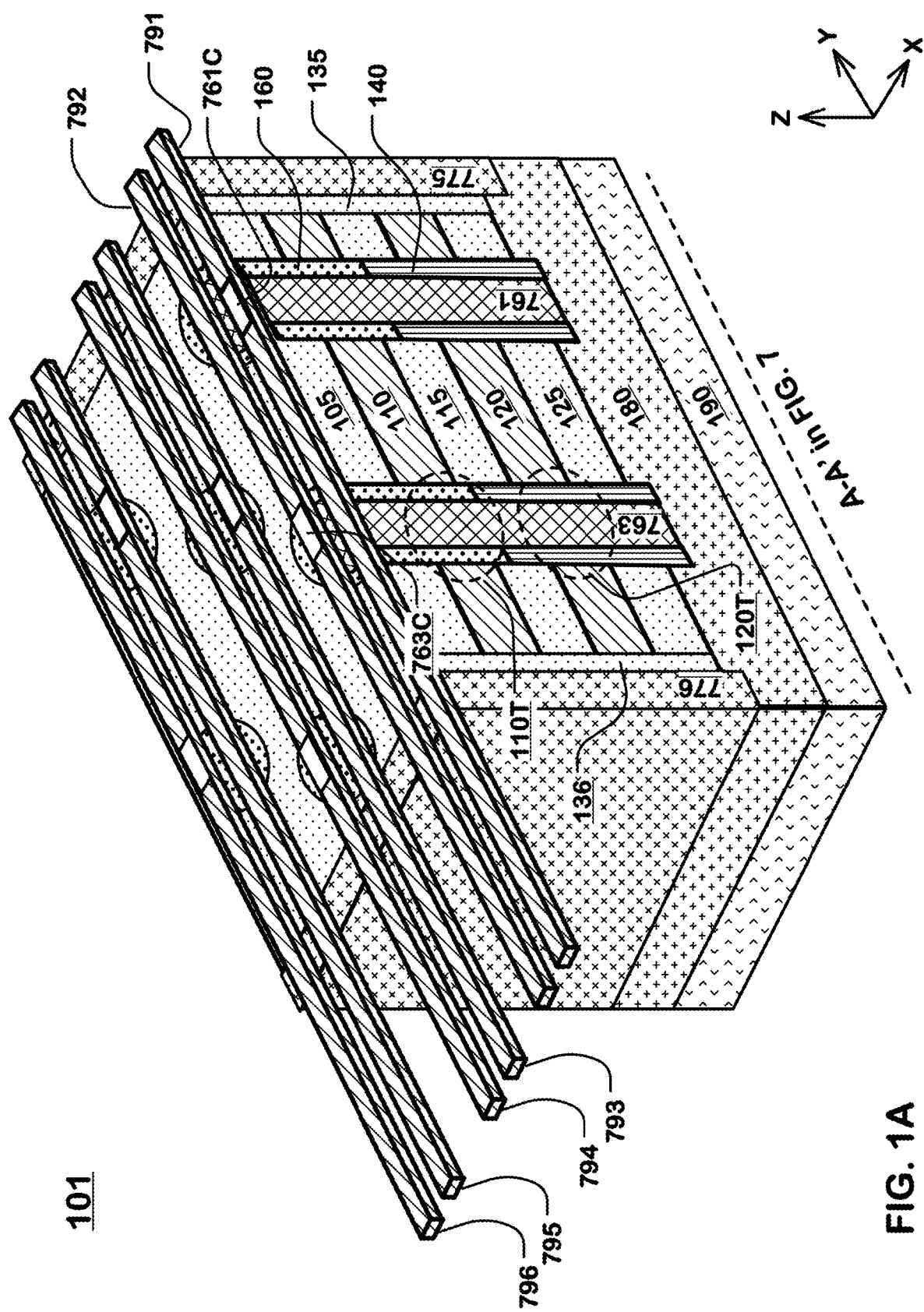
FIG. 1A illustrates a memory device comprising an array of two-transistor memory cells, two-transistor memory cells in the array including a vertical select transistor and a vertical data storage transistor, according to one embodiment.

A detailed description of embodiments of the present technology is provided with reference to the Figures. The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. A detailed description of embodiments of the present technology is provided with reference to the Figures. Like elements in various figures are commonly referred to with like reference numerals.

FIG. 1A illustrates a memory device comprising an array of two-transistor memory cells 101, two-transistor memory cells in the array including a vertical select transistor (e.g. 110T) and a vertical data storage transistor (e.g. 120T), according to one embodiment. A cross-section shown in the Y-Z plane as shown in FIG. 1A is taken along a line A-A' in FIG. 7. The array of two-transistor memory cells comprises a plurality of stacks of conductive lines separated by insulating layers (e.g. 105, 115, 125) on a reference line 180 on a substrate 190. A stack of conductive lines in the plurality of stacks includes a select gate line 110 and a word line 120 adjacent the select gate line 110. In one embodiment, the word line can be beneath the select gate line. In an alternative embodiment, the word line can be above the select gate line.

The memory device includes an array of vertical channel lines (e.g. 761, 763) disposed in vias or holes through the conductive lines in the plurality of stacks to the reference line. A two-transistor memory cell suitable for use in an array of two-transistor memory cells, including a gate dielectric structure 160 and a charge storage structure 140, is further described in reference to FIG. 2.

The memory device includes a plurality of bit lines (e.g. 791, 792, 793, 794, 795, 796) overlying the array of vertical channel lines (e.g. 761, 763) coupled to the vertical channel lines via upper ends of the vertical channel lines. The bit lines (e.g. 791, 792) are coupled to respective vertical channel lines (e.g. 761, 763) of the cells in one-column via respective contacts 761C and 763C. As further described in reference to FIG. 7, the array can include a set of two-transistor cells arranged in a number X of columns and a number Y of rows of cells, the select gate line and the word line can each surround the cells in the set of cells, and the plurality of bit lines can include a number X times a number Y of bit lines coupled to respective vertical channel lines of the cells in the set of cells.

The memory device includes a first interlayer reference line contact 775 adjacent the stack of conductive lines, and a second interlayer reference line contact 776 adjacent the stack of conductive lines and opposite the first interlayer reference line contact 775. The stack of conductive lines is electrically isolated from the first interlayer reference line contact 775 by an isolation structure 135 disposed between the stack of conductive lines including a select gate line 110 and a word line 120 and the first interlayer reference line contacts 775. The stack of conductive lines is electrically isolated from the second reference line contact 776 by an isolation structure 136 disposed between the stack of conductive lines and the second interlayer reference line contacts 776. The first and second reference line contacts 775 and 776 are electrically coupled to the lower ends of the vertical channel lines via the reference line 180.

Figure 1B:
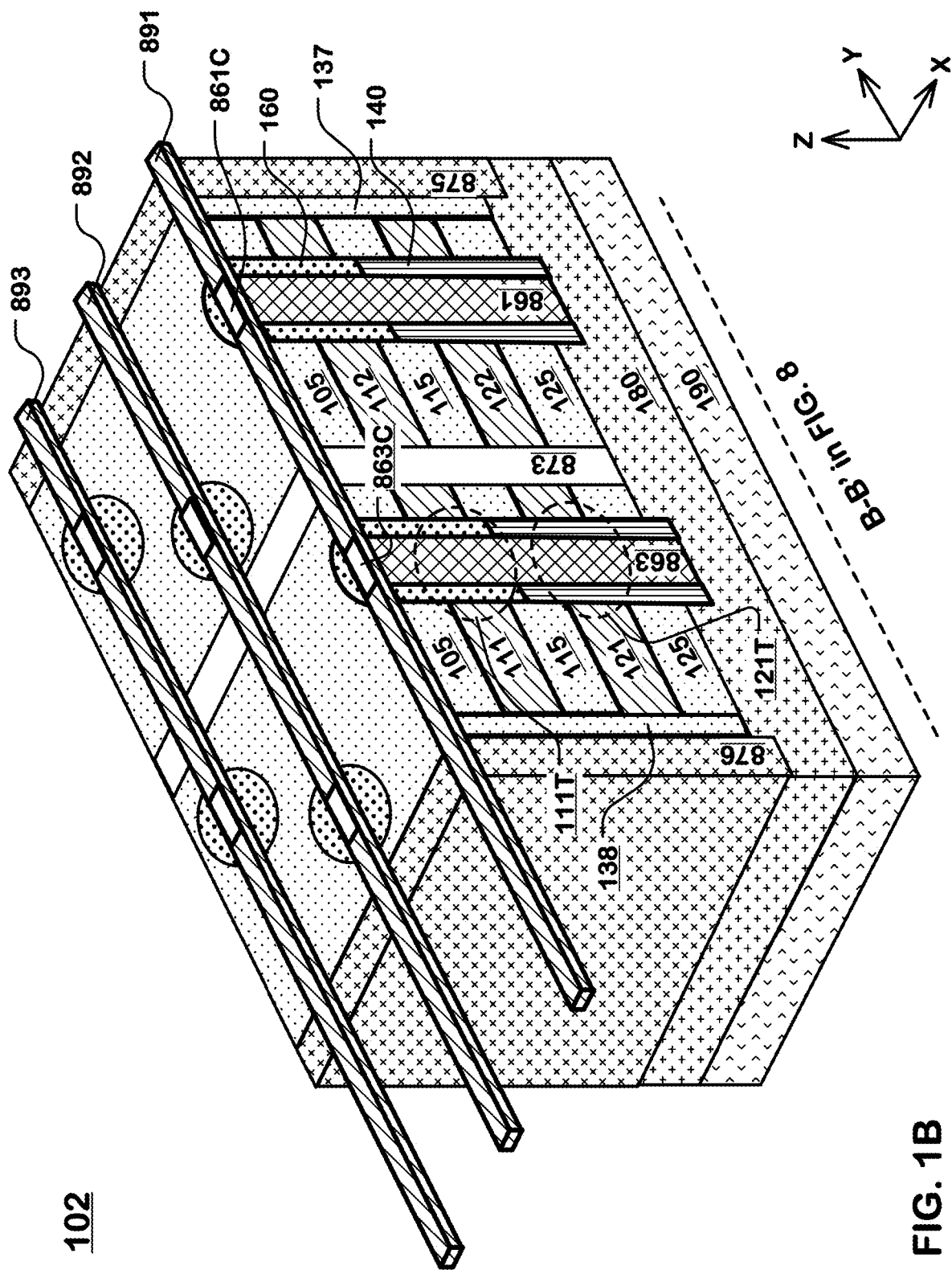
FIG. 1B illustrates a memory device comprising an array of two-transistor memory cells, two-transistor memory cells in the array including a vertical select transistor and a vertical data storage transistor, according to an alternative embodiment.

FIG. 1B illustrates a memory device comprising an array of two-transistor memory cells 102, two-transistor memory cells in the array including a vertical select transistor (e.g. 111T) and a vertical data storage transistor (e.g. 121T), according to an alternative embodiment. A cross-section shown in the Y-Z plane as shown in FIG. 1B is taken along a line B-B' in FIG. 8. The array of two-transistor memory cells comprises a plurality of stacks of conductive lines separated by insulating layers (e.g. 105, 115, 125) on a reference line 180 on a substrate 190. A first stack of conductive lines in the plurality of stacks includes a select gate line 111 and a word line 121 adjacent the select gate line 111. In one embodiment, the word line can be beneath the select gate line. In an alternative embodiment, the word line can be above the select gate line. A second stack of conductive lines in the plurality of stacks includes a select gate line 112 and a word line 122 adjacent the select gate line 112.

The first stack of conductive lines is electrically isolated from the second stack of conductive lines by an isolation structure 873.

The memory device includes an array of vertical channel lines (e.g. 861, 863) disposed in vias or holes through the conductive lines in the plurality of stacks to the reference line. A two-transistor memory cell suitable for use in an array of two-transistor memory cells, including a gate dielectric structure 160 and a charge storage structure 140, is further described in reference to FIG. 2.

The memory device includes a plurality of bit lines (e.g. 891, 892, 893) overlying the array of vertical channel lines (e.g. 861, 863) coupled to the vertical channel lines via upper ends of the vertical channel lines. The bit line (e.g. 891) is coupled to vertical channel lines (e.g. 861 and 863) of the cells in one-column in the array via respective contacts 861C and 863C. As further described in reference to FIG. 8, the array can include a set of cells arranged in a number X of columns and a number Y of rows of cells, the set of cells having a first subset of cells and a second subset of cells, the first and second subsets of cells each arranged in the number X of columns and the number Y/2 of rows of cells. The first-mentioned select gate line and the first-mentioned word line can each surround the cells in one of the first and second subsets of cells. A second select gate line and a second word line can each surround the cells in another of the first and second subsets of cells. The plurality of bit lines can include a number X times a number Y/2 of bit lines each coupled to a vertical channel line of a first cell in the first subset of cells and a vertical channel line of a second cell in the second subset of cells.

The memory device includes a first interlayer reference line contact 875 adjacent the first stack of conductive lines. The first stack of conductive lines is electrically isolated from the interlayer reference line contact 875 by an isolation structure 137 disposed between the first stack of conductive lines and the interlayer reference line contacts 875. The reference line contact 875 is electrically coupled to the lower ends of the vertical channel lines via the reference line 180. The memory device also includes a second interlayer reference line contact 876 adjacent the second stack of conductive lines. The second stack of conductive lines is electrically isolated from the interlayer reference line contact 876 by an isolation structure 138 disposed between the second stack of conductive lines and the interlayer reference line contacts 876. The reference line contact 876 is electrically coupled to the lower ends of the vertical channel lines via the reference line 180.

Figure 2:
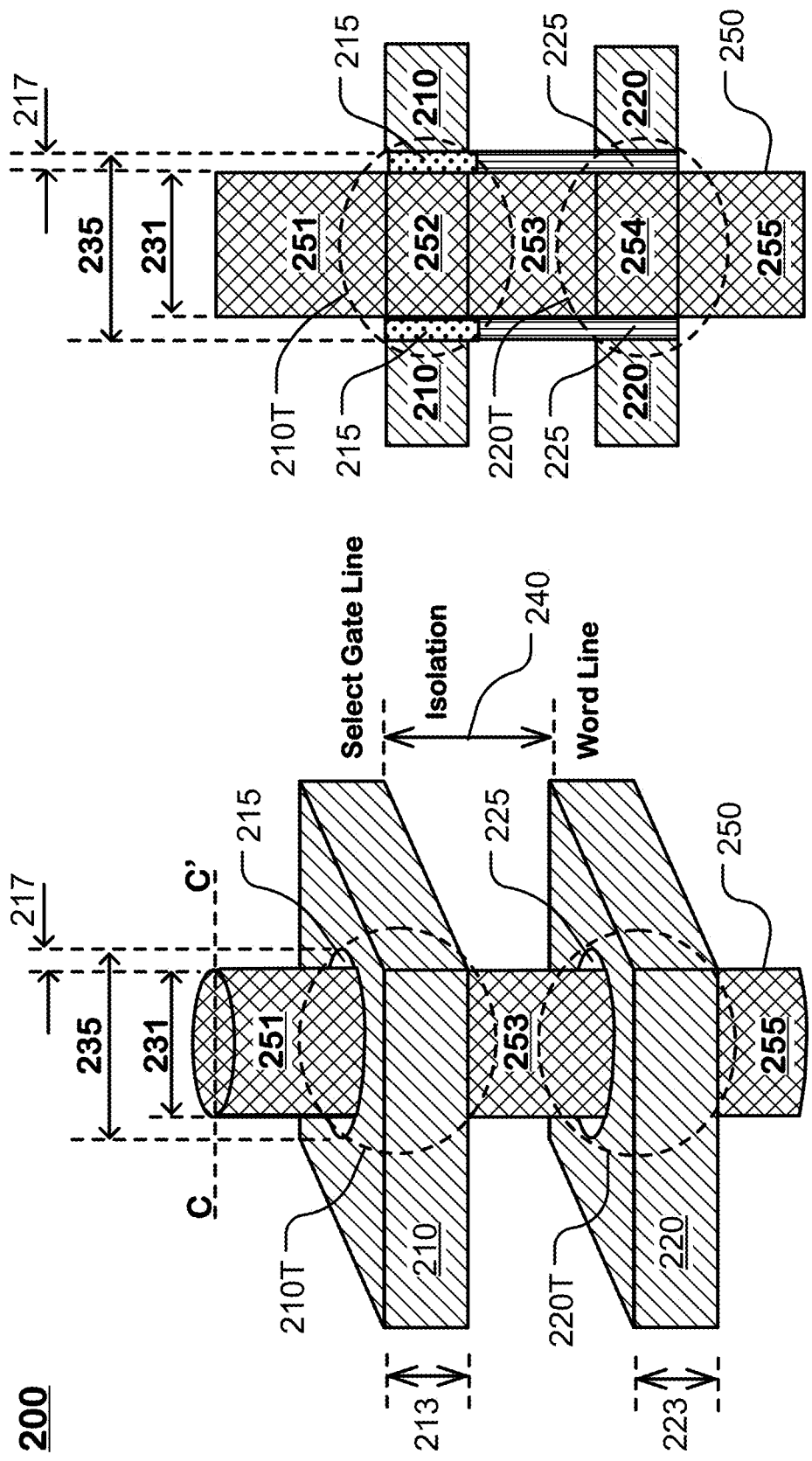
FIG. 2 illustrates an example two-transistor memory cell suitable for use in an array of two-transistor memory cells.

FIG. 2 illustrates an example two-transistor memory cell suitable for use in an array of two-transistor memory cells. FIGS. 2A, 2B and 2C each illustrate a cross section of the two-transistor memory cell illustrated in FIG. 2 taken at a line C-C' in accordance with embodiments further described in reference to FIGS. 3A-3G, 4A-4H, and 5A-5G, respectively. In FIGS. 2, 2A, 2B and 2C, a two-transistor memory cell 200 includes a vertical select transistor 210T having a first channel region 252 in a vertical semiconductor pillar 250, and a vertical data storage transistor 220T having a second channel region 254 in the vertical semiconductor pillar 250.

In FIGS. 2, 2A, 2B and 2C, the vertical semiconductor pillar 250 has a top region 251 above the first channel region 252 acting as a first current conducting terminal of the vertical select transistor 210T, and a bottom region 255 below the second channel region 254 acting as a second current conducting terminal of the vertical data storage transistor 220T. The vertical semiconductor pillar 250 has an intermediate region 253 between the first channel region 252 and the second channel region 254 acting as a second current conducting terminal of the vertical select transistor 210T and a first current conducting terminal of the vertical data storage transistor 220T.

A bit line (e.g. 791, FIG. 1A) can be coupled to the top region 251 of the vertical semiconductor pillar 250. A reference line (e.g. 180, FIG. 1A) can be coupled to the bottom region 255 of the vertical semiconductor pillar 250. A select gate line 210 surrounds the first channel region 252 in the vertical semiconductor pillar 250, and a gate dielectric structure 215 is disposed between the select gate line 210 and the first channel region 252 in the vertical semiconductor pillar 250.

In an embodiment illustrated by FIG. 2A, a word line 220 surrounds the second channel region 254 in the vertical semiconductor pillar 250, and a charge storage structure 225 is disposed on side surfaces of the word line 220, and between the word line 220 and the second channel region 254 in the vertical semiconductor pillar 250. A gate dielectric structure 215 is disposed between the select gate line 210 and the first channel region 252 in the vertical semiconductor pillar 250. In this embodiment, the gate dielectric structure 215 is not disposed between the second channel region 254 and the charge storage structure 225 on side surfaces of the word line 220. This embodiment is further described in reference to FIGS. 3A-3G.

In an embodiment illustrated by FIG. 2B, a word line 220 surrounds the second channel region 254 in the vertical semiconductor pillar 250, and a charge storage structure 225 is disposed on side surfaces of the word line 220, and between the word line 220 and the second channel region 254 in the vertical semiconductor pillar 250. A gate dielectric structure 215 is disposed between the select gate line 210 and the first channel region 252 in the vertical semiconductor pillar 250, and is continuous along the vertical semiconductor pillar 250, so that the gate dielectric structure 215 is also disposed between the second channel region 254 and the charge storage structure 225 on side surfaces of the word line 220. This embodiment is further described in reference to FIGS. 4A-4H.

In an embodiment illustrated by FIG. 2C, a word line 220 surrounds the second channel region 254 in the vertical semiconductor pillar 250, and a charge storage structure 225 is disposed on top, bottom and side surfaces of the word line 220, and between the word line 220 and the second channel region 254 in the vertical semiconductor pillar 250. A gate dielectric structure 215 is disposed between the select gate line 210 and the first channel region 252 in the vertical semiconductor pillar 250, and is continuous along the vertical semiconductor pillar 250, so that the gate dielectric structure 215 is also disposed between the second channel region 254 and the charge storage structure 225 on side surfaces of the word line 220. This embodiment is further described in reference to FIGS. 5A-5G.

In one embodiment, the first channel region 252 of the vertical select transistor 210T in the vertical semiconductor pillar 250 can have a channel length 213 of about 20 nm to 60 nm (nm=nanometer) determined by a thickness of the select gate line 210, and a second channel region 254 of the vertical data storage transistor 220T in the vertical semiconductor pillar 250 can have a channel length 223 of about 20 nm to 60 nm determined by a thickness of the word line 220. An isolation 240 between the select gate line 210 and the word line 220 can have a thickness of about 20 nm to 50 nm. The vertical semiconductor pillar 250 can have a channel diameter 231 of about 50 nm to 90 nm. The gate dielectric structure 215 disposed between the vertical semiconductor pillar 250 and the select gate line 210 can have a dielectric thickness 217 of about 2 nm to 3 nm. A channel hole diameter 235 is equal to the channel diameter 231 plus twice the dielectric thickness 217.

In embodiments, a multilayer charge storage structure 225 disposed between the vertical semiconductor pillar 250 and the word line 220 can include charge trapping layers having SiON/Oxide/Nitride/Oxide with respective thicknesses 2.5 nm/3 nm/5 nm/6 nm, or floating gate layers having oxide/ poly silicon/oxide with respective thicknesses 6 nm/7 nm/5 nm. A high-k liner can be formed between the multilayer charge storage structure 225 and the word line 220 and in contact with the word line 220. A high-k liner can include Al2O3 with a thickness of about 3 nm for example. The first and second channel regions 252 and 254 in the vertical semiconductor pillar 250 can include undoped polysilicon.

A threshold voltage of the vertical select transistor 210T can be about 0V to 1V, and a threshold voltage of the vertical data storage transistor 220T can be about 0V, depending on the dimensions and materials of the elements used to implement the vertical select transistor 210T and the vertical data storage transistor 220T. Here the elements can include the vertical semiconductor pillar 250, the select gate line 210, and the word line 220.

FIGS. 3A through 3G illustrate an example process flow for manufacturing a two-transistor memory cell that includes a vertical select transistor and a vertical data storage transistor, in accordance with a first embodiment.

FIG. 3A illustrates a stage of the process flow after forming a plurality of stacks of sacrificial lines separated by insulating layers (e.g. 305, 315, 325) on a reference line 380 on a substrate 390. Although only one of the stacks is shown, a plurality of stacks of sacrificial lines can be formed in a process to form an array of two-transistor memory cells.

A stack in the plurality of stacks of sacrificial lines can include a first sacrificial line 310 and a second sacrificial line 320 adjacent the first sacrificial line. In one embodiment, the second sacrificial line can be beneath the first sacrificial line. In an alternative embodiment, the second sacrificial line can be above the first sacrificial line. At a later process step, the first sacrificial line 310 and the second sacrificial line 320 can be replaced with a conductive material to form a select gate line and a word line adjacent the select gate line.

The sacrificial material in the sacrificial lines can include silicon nitride (SiN). The insulating layers can include silicon dioxide. The sacrificial material and the insulating layers can be deposited in a variety of ways as known in the art. The reference line can be in an N+ well, a metal layer or other structures.

FIG. 3B illustrates a stage of the process flow after forming an array of vias or holes 330 through the sacrificial lines in the plurality of stacks of sacrificial lines to the reference line. The first sacrificial line and the second sacrificial line have side surfaces (e.g. 311, 321) exposed in the holes in the array of holes.

FIG. 3C illustrates a stage of the process flow after forming layers of material 340 used as charge storage structures lining the vias or holes 330, so that it is disposed on side surfaces of the first sacrificial line and the second sacrificial line in holes in the array of holes. The layers of material are also formed on bottoms of the vias or holes 330 in the array of holes. The layers of material can include charge trapping layers having SiON/Oxide/Nitride/Oxide with respective thicknesses 2.5 nm/3 nm/5 nm/6 nm, or floating gate layers having oxide/poly silicon/oxide with respective thicknesses 6 nm/7 nm/5 nm.

FIG. 3D illustrates a stage of the process flow after removing the layers of material 340 on the side surfaces of the first sacrificial line in holes in the array of holes by anisotropic etching, while keeping the layers of material 340 on the side surfaces of the second sacrificial line 320 in holes 330 in the array of holes. At this stage, the layers of material 340 formed on the bottoms of the vias or holes 330 are also removed by etching.

Figure 3E:
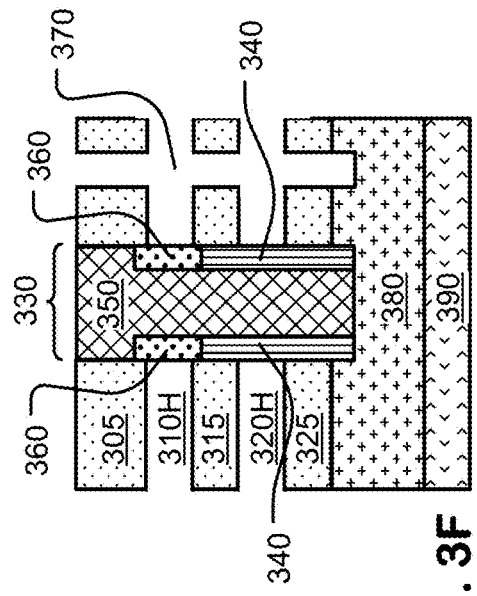

FIG. 3E illustrates a stage of the process flow after forming vertical channel lines 350 in the array of vertical channel lines in the vias or holes 330. The vertical channel lines can be formed using epitaxial formation. In one embodiment, after the vertical channel lines 350 is formed, arsenic implantation can be performed on the top surface of the vertical channel lines 350 to form a contact (e.g. 761C, FIG. 7) for connection to a bit line (e.g. 791, FIG. 7).

Figure 3F:
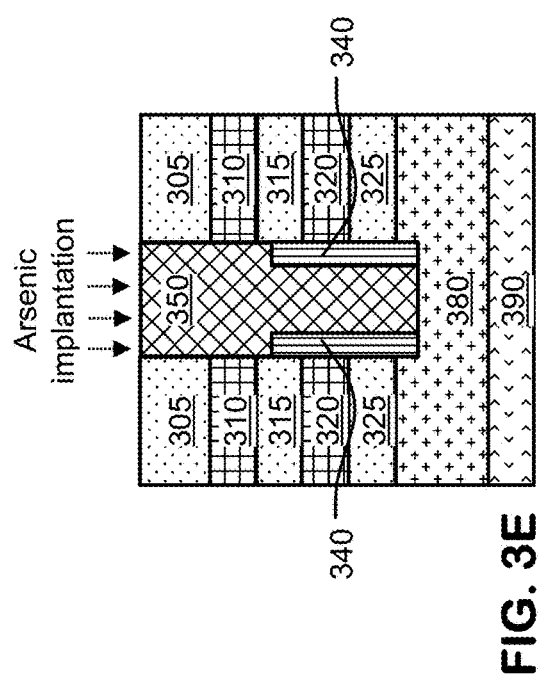

FIG. 3F illustrates a stage of the process flow after forming a reference line contact hole 370 through the stack of sacrificial lines (e.g. 310, 320) and the insulating layers (e.g. 305, 315, 325) to the reference line 380, removing the first sacrificial line 310 (FIG. 3E) to form first horizontal openings 310H between the insulating layers (e.g. 305, 315), and removing the second sacrificial line 320 (FIG. 3E) to form second horizontal openings 320H between the insulating layers (e.g. 315, 325).

The gate dielectric structures 360 can then be formed on side surfaces of the vertical channel lines 350 in the first horizontal openings 310H by oxidation on the side surfaces. For example, the vertical channel lines 350 can include silicon and the gate dielectric structures 360 can include silicon oxide as result of the oxidation.

Figure 3G:
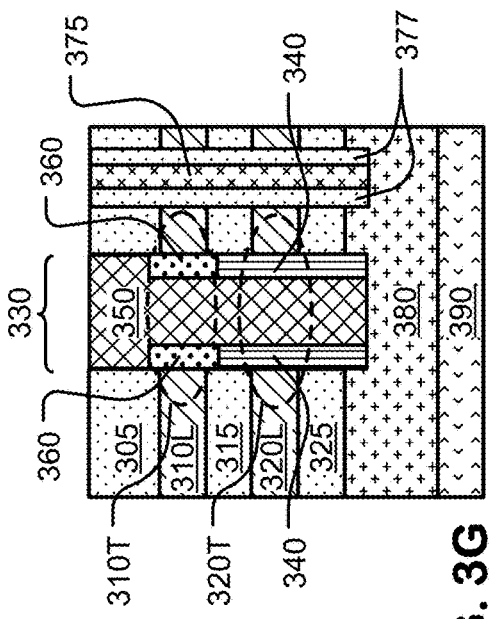

FIG. 3G illustrates a stage of the process flow after filling the first horizontal openings 310H (FIG. 3F) and the second horizontal openings 320H (FIG. 3F) with a conductive material, to form a select gate line 310L and a word line 320L adjacent the select gate line. In one embodiment, a high-k liner (e.g. Al2O3 with a thickness of about 3 nm) can be first formed on surfaces of the first and second horizontal openings, and a conductive material including TiN (titanium nitride) can then be deposited in the first and second horizontal openings in contact with the high-k liner in the first and second horizontal openings.

The gate dielectric structures 360 surround the vertical channel lines 350 at channel regions of vertical select transistors 310T in the array of vertical channel lines 350 and the select gate lines 310L. The charge storage structures 340 surround the vertical channel lines 350 at channel regions of vertical data storage transistors 320T in the array of vertical channel lines 350 and the word lines 320L.

An interlayer reference line contact 375 can be formed in the reference line contact hole 370 (FIG. 3F) through the select gate line 310L and the word line 320L to the reference line 380. Lower ends of the vertical channel lines 350 are connected for current flow to the reference line 380, and the reference line contact 375 is electrically coupled to the lower ends of the vertical channel lines 350 via the reference line 380. An isolation structure 377 is formed between the interlayer reference line contact 375 and a stack of conductive lines including the select gate line 310L and the word line 320L.

FIGS. 4A through 4G illustrate an example process flow for manufacturing a two-transistor memory cell that includes a vertical select transistor and a vertical data storage transistor, in accordance with a second embodiment.

Figure 4A:
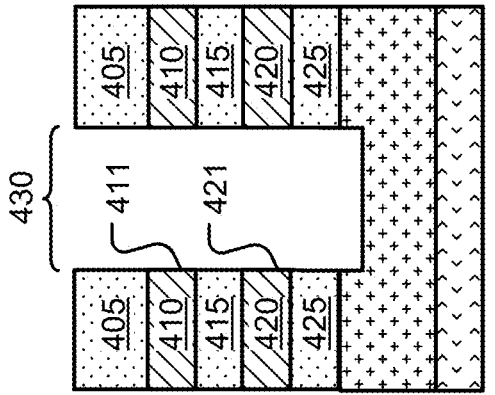
FIGS. 4A through 4H illustrate an example process flow for manufacturing a two-transistor memory cell that includes a vertical select transistor and a vertical data storage transistor, in accordance with a second embodiment.

FIG. 4A illustrates a stage of the process flow after forming a plurality of stacks of conductive lines separated by insulating layers (e.g. 405, 415, 425) on a reference line 480 on a substrate 490. Although only one of the stacks is shown, a plurality of stacks of conductive lines can be formed in a process to form an array of two-transistor memory cells. A stack in the plurality of stacks of conductive lines can include a select gate line 410 and a word line 420 adjacent the select gate line. In one embodiment, the word line can be beneath the select gate line. In an alternative embodiment, the word line can be above the select gate line.

The conductive material in the conductive lines in the stacks of conductive lines can comprise conductive materials such as polysilicon having n-type or p-type doping, tungsten, titanium, other metals or metallic alloys and metallic materials such as TiN, TaN, Pt, W, etc. The insulating layers can include silicon dioxide. The conductive material and the insulating layers can be deposited in a variety of ways as known in the art. The reference line can be in an N+ well, a metal layer or other structures.

Figure 4B:
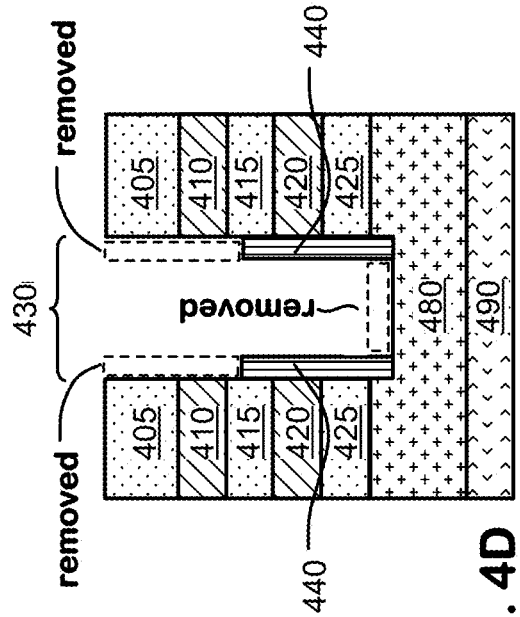

FIG. 4B illustrates a stage of the process flow after forming an array of vias or holes 430 through the select gate line 410 and the word line 420 in the plurality of stacks of conductive lines to the reference line 480. The select gate line 410 and the word line 420 have side surfaces (e.g. 411, 421) exposed in the holes in the array of holes.

Figure 4C:
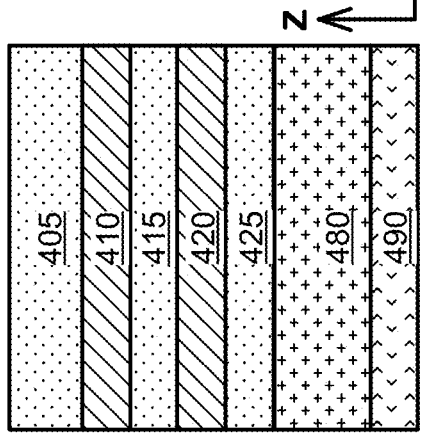

FIG. 4C illustrates a stage of the process flow after forming layers of material as charge storage structures 440 lining the holes 430, so that the layers of material are disposed on side surfaces of the select gate line 410 and the word line 420 in the plurality of stacks of conductive lines in the vias or holes 430. The layers of material used as charge storage structures can include an oxide material such as silicon dioxide with a thickness of about 6 nm and nitride with a thickness of about 5 nm. In one embodiment, a high-k liner (not shown) can be first formed on surfaces of the vias or holes 430, so the high-k liner is disposed between the layers of material used as charge storage structures 440 and the side surfaces of the select gate line 410 and the word line 420. A high-k liner can include Al2O3 with a thickness of about 3 nm for example. The layers of material 440 are also formed on bottoms of the vias or holes 430.

Figure 4D:
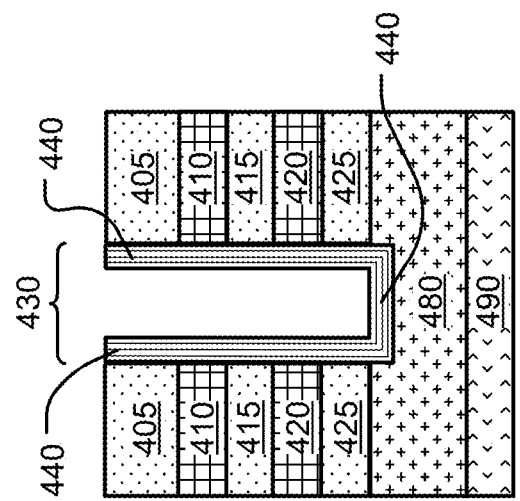

FIG. 4D illustrates a stage of the process flow after removing the layers of material used as charge storage structures 440 on the side surfaces 411 (FIG. 4B) of the select gate line 410 in the plurality of stacks of conductive lines in the vias or holes 430 by anisotropic etching, while keeping the layers of material 440 on the side surfaces 421 (FIG. 4B) of the word line 420 in the plurality of stacks of conductive lines in the vias or holes 430. At this stage, the layers of material 440 formed on the bottoms of the holes 430 are also removed by etching.

Figure 4F:
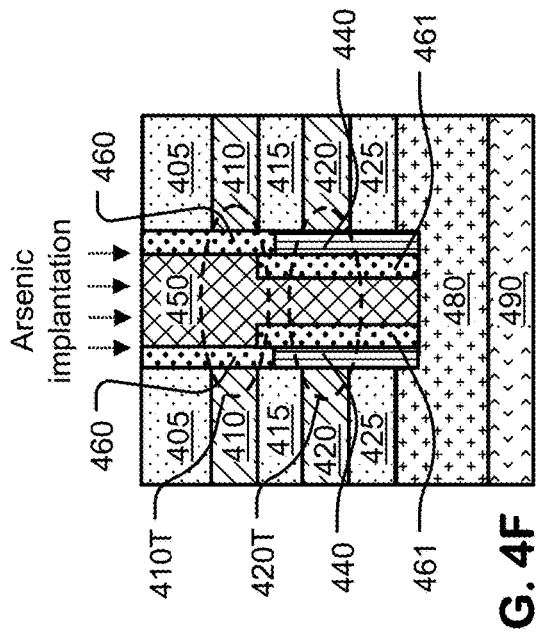
Figure 4H:
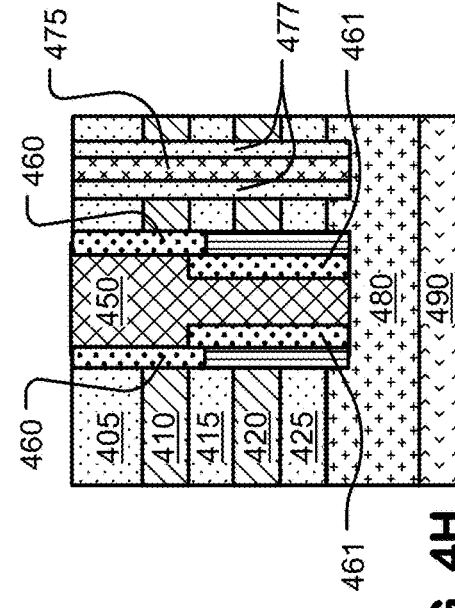
Figure 4E:
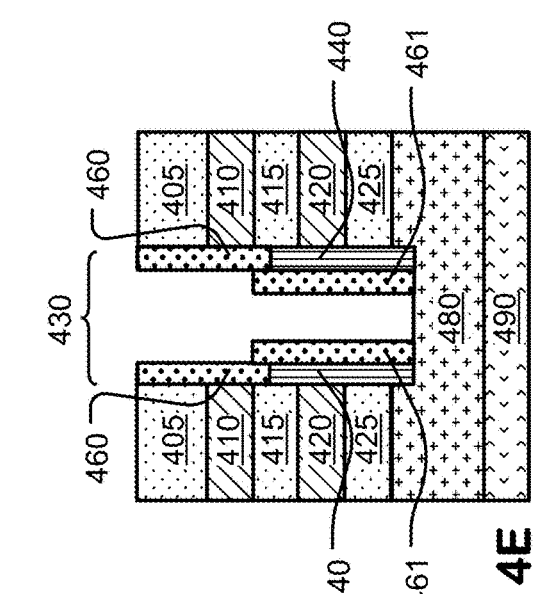

FIG. 4E illustrates a stage of the process flow after forming gate dielectric structures 460 on the side surfaces 411 (FIG. 4B) of the select gate lines 410. The gate dielectric structures 460 are also formed on the layers of material used as the charge storage structures 440 disposed on the side surfaces 421 (FIG. 4B) of the word line 420 in the plurality of stacks of conductive lines in the vias or holes 430. Portions of the gate dielectric structures formed on the layers of material used as the charge storage structures 440 can act as a tunneling layer 461 in multilayer charge storage structures that also include the charge storage structures 440. The gate dielectric structures 460 can include an oxide material such as silicon oxide with a thickness of about 3 nm, and SiON with a thickness of about 2.5 nm.

FIG. 4F illustrates a stage of the process flow after forming vertical channel lines 450 in the array of vertical channel lines in the holes 430 (FIG. 4E). The vertical channel lines can be formed using epitaxial formation. In one embodiment, after the vertical channel lines 450 is formed, arsenic implantation can be performed on the top surface of the vertical channel lines 450 to form a contact (e.g. 761C, FIG. 7) for connection to a bit line (e.g. 791, FIG. 7).

The gate dielectric structures 460 surround the vertical channel lines 450 at channel regions of vertical select transistors 410T in the array of vertical channel lines 450 and the select gate lines 410. The final multilayer charge storage structures including the tunneling layer 461 and the charge storage structures 440 surround the vertical channel lines 450 at channel regions of vertical data storage transistors 420T in the array of vertical channel lines 450 and the word lines 420.

Figure 4G:
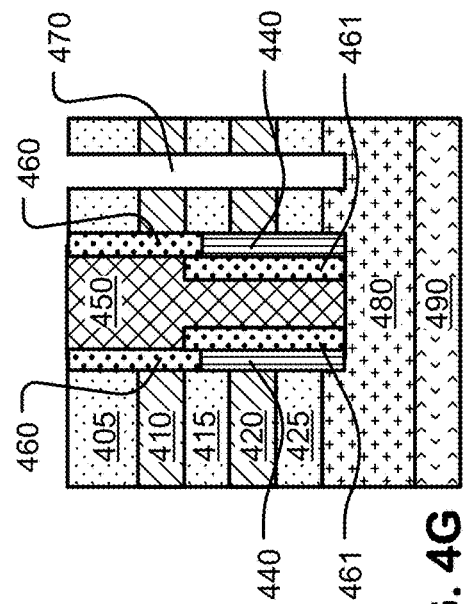

FIG. 4G illustrates a stage of the process flow after forming a reference line contact hole 470 through the select gate line 410 and the word line 420 in the plurality of stacks of conductive lines to the reference line 480.

FIG. 4H illustrates a stage of the process flow after forming an interlayer reference line 475 in the reference line contact hole 470 (FIG. 4G) through the select gate line 410 and the word line 420 in the plurality of stacks of conductive lines to the reference line 480. Lower ends of the vertical channel lines 450 are connected for current flow to the reference line 480, and the interlayer reference line contact 475 is electrically coupled to the lower ends of the vertical channel lines 450 via the reference line 480. An isolation structure 477 is formed between the interlayer reference line contact 475 and a stack of conductive lines including the select gate line 410 and the word line 420.

FIGS. 5A through 5G illustrate an example process flow for manufacturing a two-transistor memory cell that includes a vertical select transistor and a vertical data storage transistor, in accordance with a third embodiment.

FIG. 5A illustrates a stage of the process flow after forming a plurality of stacks of conductive lines and sacrificial lines separated by insulating layers (e.g. 505, 515, 525) on a reference line 580 on a substrate 590. Although only one of the stacks is shown, a plurality of stacks of conductive lines and sacrificial lines can be formed in a process to form an array of two-transistor memory cells.

A stack in the plurality of stacks can include a first conductive line 510 and a second sacrificial line 520 adjacent the first conductive line. The first conductive line 510 can act as a select gate line. In one embodiment, the second sacrificial line can be beneath the first conductive line. In an alternative embodiment, the second sacrificial line can be above the first conductive line. At a later process step, the second sacrificial line 520 can be replaced with a conductive material to form a word line adjacent the select gate line.

The conductive material in the conductive lines in the stacks of conductive lines can comprise conductive materials such as polysilicon having n-type or p-type doping, tungsten, titanium, other metals or metallic alloys and metallic materials such as TiN, TaN, Pt, W, etc. The sacrificial material in the sacrificial lines can include silicon nitride (SiN). The insulating layers can include silicon dioxide. The conductive material, the sacrificial material and the insulating layers can be deposited in a variety of ways as known in the art. The reference line can be in an N+ well, a metal layer or other structures.

FIG. 5B illustrates a stage of the process flow after forming an array of vias or holes 530 through the conductive lines and the sacrificial lines in the plurality of stacks to the reference line. The first conductive line and the second sacrificial line have side surfaces (e.g. 511, 521) exposed in the holes in the array of holes.

FIG. 5C illustrates a stage of the process flow after forming gate dielectric structures 560 lining the holes 530, so that it is disposed on the side surfaces (e.g. 511, 521, FIG. 5B) of the first conductive line 510 and the second sacrificial line 520 in the holes 530, and also disposed on the bottom surface of the holes 530. For instance, the gate dielectric structures 560 can be formed by first depositing an oxide material such as silicon dioxide with a thickness of about 3 nm, and then depositing SiON with a thickness of about 2.5 nm. The oxide material and SiON deposited on the bottom surface of the holes 530 can then be removed using for example anisotropic etching.

FIG. 5D illustrates a stage of the process flow after forming vertical channel lines 550 in the array of vertical channel lines in the vias or holes 530 (FIG. 5C) in the array of holes. The vertical channel lines can be formed using epitaxial formation. In one embodiment, after the vertical channel lines 550 is formed, arsenic implantation can be performed on the top surface of the vertical channel lines 550 to form a contact (e.g. 761C, FIG. 7) for connection to a bit line (e.g. 791, FIG. 7). The gate dielectric structures 560 surround the vertical channel lines 550 at channel regions of vertical select transistors 510T in the array of vertical channel lines 550 and the select gate lines 510.

Figure 5E:
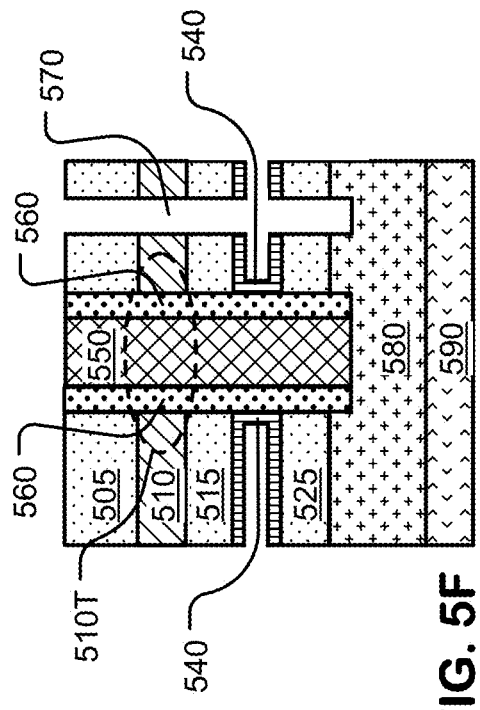

FIG. 5E illustrates a stage of the process flow after forming a reference line contact hole 570 through the first conductive line 510, the second sacrificial line 520 (FIG. 5D), and the insulating layers (e.g. 505, 515, 525) to the reference line 580, and removing the second sacrificial line 520 (FIG. 5D) to form second horizontal openings 520H between the insulating layers (e.g. 515, 525).

Figure 5F:
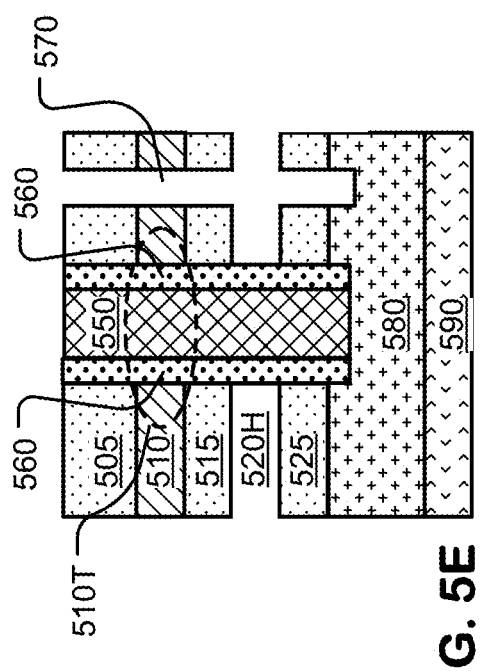

FIG. 5F illustrates a stage of the process flow after forming layers of material 540 used as charge storage structures on side surfaces of the vertical channel lines 550 in the second horizontal openings. The layers of material 540 can include charge trapping layers having Nitride and Oxide with respective thicknesses 5 nm and 6 nm, or floating gate layers having oxide/poly silicon/oxide with respective thicknesses 6 nm/7 nm/5 nm.

Figure 5G:
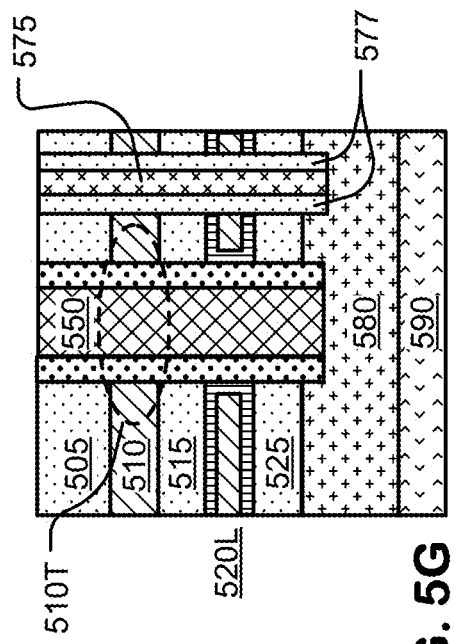

FIG. 5G illustrates a stage of the process flow after filling the second horizontal openings 520H (FIG. 5E) with a conductive material to form a word line 520L adjacent the select gate line 510, and forming an interlayer reference line contact 575 in the reference line contact hole 570 (FIG. 5F) through the select gate line 510 and the word line 520L in the plurality of stacks to the reference line 580. In one embodiment, a high-k liner (not shown) can be first formed on surfaces of the second horizontal openings (FIG. 5E), and a conductive material including TiN (titanium nitride) can then be deposited in the second horizontal openings in contact with the high-k liner (e.g. Al2O3 with a thickness of about 3 nm).

Lower ends of the vertical channel lines 550 are connected for current flow to the reference line 580, and the interlayer reference line contact 575 is electrically coupled to the lower ends of the vertical channel lines 550 via the reference line 580. An isolation structure 577 is formed between the interlayer reference line contact 575 and a stack of conductive lines including the select gate line 510 and the word line 520L.

Figure 6:
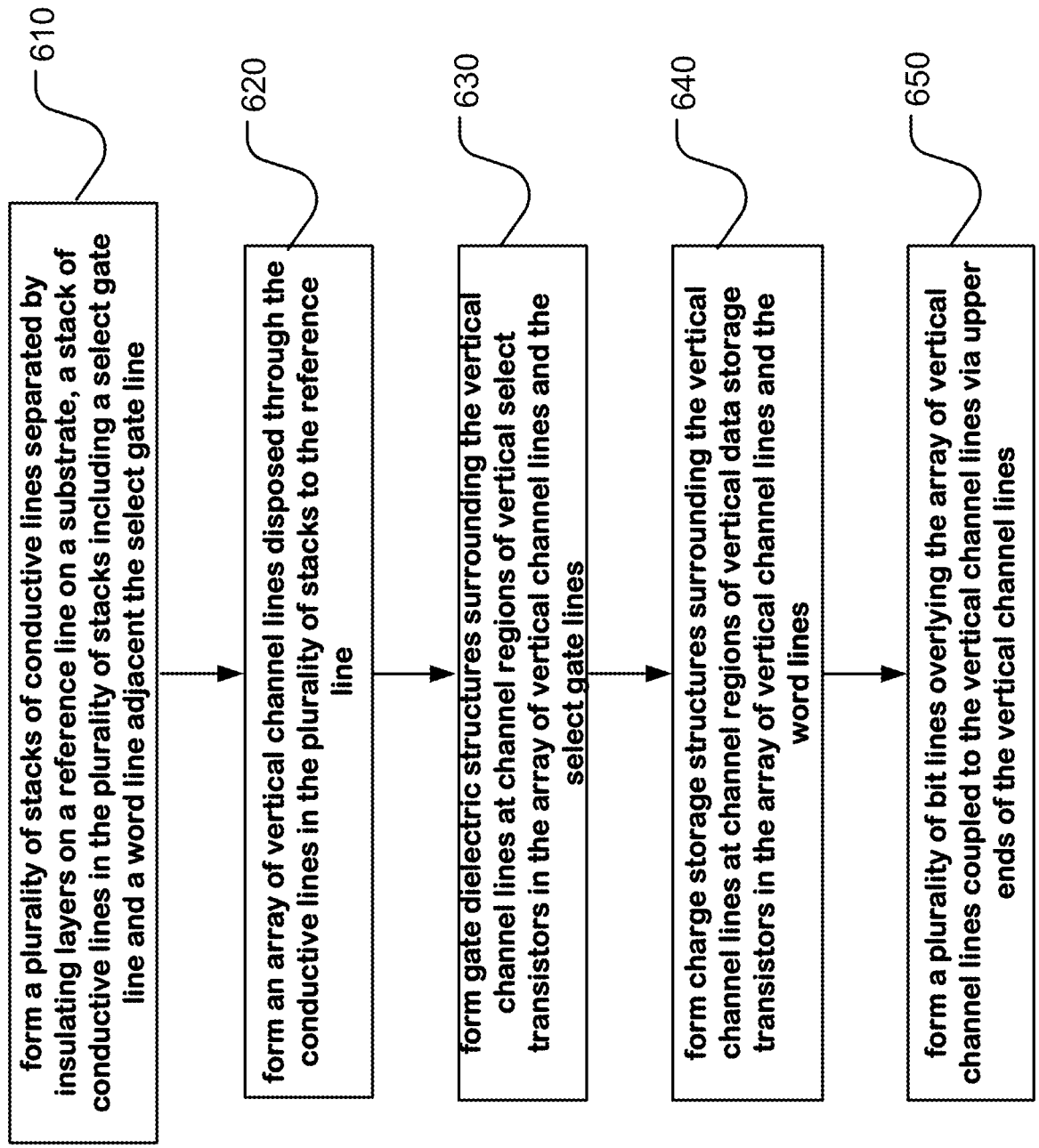
FIG. 6 is an example flow chart illustrating an example process flow for manufacturing an array of two-transistor memory cells, two-transistor memory cells in the array including a vertical select transistor and a vertical data storage transistor, in accordance with the present technology.

FIG. 6 is an example flow chart illustrating an example process flow for manufacturing an array of two-transistor memory cells, two-transistor memory cells in the array including a vertical select transistor and a vertical data storage transistor, in accordance with the present technology.

At Step 610, the process flow includes forming a plurality of stacks of conductive lines separated by insulating layers on a reference line on a substrate. A stack of conductive lines in the plurality of stacks includes a select gate line and a word line adjacent the select gate line. In one embodiment, the word line can be beneath the select gate line. In an alternative embodiment, the word line can be above the select gate line. In one embodiment as described in reference to FIGS. 3A to 3F, a plurality of stacks of conductive lines can be formed by forming a plurality of stacks of sacrificial lines (e.g. 310, 320, FIG. 3A) separated by insulating layers a reference line on a substrate, and later replacing the sacrificial lines with a conductive material (e.g. 310L, 320L, FIG. 3G).

In an alternative embodiment as described in reference to FIGS. 4A to 4H, a plurality of stacks of conductive lines (e.g. 410, 420, FIG. 4A) separated by insulating layers can be formed on a reference line on a substrate, without first forming sacrificial lines and later replacing the sacrificial lines with a conductive material as described in reference to FIGS. 3A to 3G.

In yet an alternative embodiment as described in reference to FIGS. 5A to 5G, a plurality of stacks of conductive lines can be formed by forming a first conductive line (e.g. 510, FIG. 5A) and a second sacrificial line (e.g. 520, FIG. 5A) adjacent the first conductive line. The first conductive line can act as a select gate line. At a later process step, the second sacrificial line can be replaced with a conductive material to form a word line (e.g. 520L, FIG. 5G) adjacent the select gate line.

At Step 620, the process flow includes forming an array of vertical channel lines disposed through the conductive lines in the plurality of stacks to the reference line. In one embodiment as described in reference to FIGS. 3A to 3F, the vertical channel lines can be formed by forming an array of holes (e.g. 330, FIG. 3B) through the sacrificial lines in the plurality of stacks of sacrificial lines, and then forming the vertical channel lines (e.g. 350, FIG. 3E) in the holes in the array of holes through the sacrificial lines.

In an alternative embodiment as described in reference to FIGS. 4A to 4H, the vertical channel lines t an array of holes (e.g. 430, FIG. 4B) through the conductive lines in the plurality of stacks of conductive lines, and then forming the vertical channel lines (e.g. 450, FIG. 4F) in the holes in the array of holes through the conductive lines.

In yet an alternative embodiment as described in reference to FIGS. 5A to 5G, the vertical channel lines can be formed by forming an array of holes (e.g. 530, FIG. 5B) through a first conductive line (e.g. 510, FIG. 5B) and a second sacrificial line (e.g. 520, FIG. 5B) in a plurality of stacks of conductive lines and sacrificial lines, and then forming the vertical channel lines (e.g. 550, FIG. 5D) in the holes in the array of holes through the first conductive line and the second sacrificial line.

At Step 630, the process flow includes forming gate dielectric structures surrounding the vertical channel lines at channel regions of vertical select transistors in the array of vertical channel lines and the select gate lines. In one embodiment as described in reference to FIGS. 3A to 3F, the gate dielectric structures can be formed by removing the first sacrificial line (e.g. 310, FIG. 3E) to form first horizontal openings (e.g. 310H, FIG. 3F) between the insulating layers, and forming the gate dielectric structures (e.g. 360, FIG. 3F) on side surfaces of the vertical channel lines (e.g. 350, FIG. 3F) in the first horizontal openings.

In an alternative embodiment as described in reference to FIGS. 4A to 4H, the gate dielectric structures can be formed by removing the charge storage structures (e.g. 440, FIG. 4C) on the side surfaces (e.g. 411, FIG. 4B) of the select gate lines (e.g. 410, FIGS. 4B, 4C, 4D) in the plurality of stacks of conductive lines in holes (e.g. 430, FIGS. 4B, 4C, 4D) in the array of holes, and then forming gate dielectric structures (e.g. 460) on the side surfaces (e.g. 411, FIG. 4B) of the select gate lines in the plurality of stacks of conductive lines in holes (e.g. 430) in the array of holes.

In yet an alternative embodiment as described in reference to FIGS. 5A to 5G, the gate dielectric structures 560 can be on the side surfaces (e.g. 511, 521, FIG. 5B) of the first conductive line 510 and the second sacrificial line 520 in holes 530 in the array of holes.

At Step 640, the process flow includes forming charge storage structures surrounding the vertical channel lines at channel regions of vertical data storage transistors in the array of vertical channel lines and the word lines. In one embodiment as described in reference to FIGS. 3A to 3F, the charge storage structures can be formed by forming an array of holes 330 through the sacrificial lines (e.g. 310, 320) in the plurality of stacks of sacrificial lines to the reference line 380, forming the layers of material used as the charge storage structures 340 disposed on side surfaces of the first sacrificial line 310 and the second sacrificial line 310 in holes in the array of holes, and removing the layers of material on the side surfaces of the first sacrificial line 310 in holes in the array of holes.

In an alternative embodiment as described in reference to FIGS. 4A to 4H, the charge storage structures can be formed by forming an array of holes 430 through the conductive lines (e.g. 410, 420) in the plurality of stacks of conductive lines, forming the charge storage structures 440 on side surfaces of the select gate lines 410 and the word lines 420 in the stacks of conductive lines in holes in the array of holes, and removing the charge storage structures on the side surfaces of the select gate lines in holes in the array of holes, while keeping the charge storage structures 440 on the side surfaces 421 of the word line 420 in the plurality of stacks of conductive lines in holes 430 in the array of holes. Gate dielectric structures 460 can be formed on the side surfaces 411 (FIG. 4B) of the select gate lines 410. The gate dielectric structures 460 can also be formed on the layers of material used as the charge storage structures 440 disposed on the side surfaces 421 (FIG. 4B) of the word line 420 in the plurality of stacks of conductive lines in the vias or holes 430. Portions of the gate dielectric structures formed on the layers of material used as the charge storage structures 440 can act as a tunneling layer 461. In this alternative embodiment, the final multilayer charge storage structures including the tunneling layer 461 and the charge storage structures 440 surround the vertical channel lines 450 at channel regions of vertical data storage transistors 420T in the array of vertical channel lines 450 and the word lines 420.

In yet an alternative embodiment as described in reference to FIGS. 5A to 5G, the charge storage structures can be formed by removing the second sacrificial line 520 to form second horizontal openings 520H between the insulating layers, and forming layers of material used as the charge storage structures 540 on side surfaces of the vertical channel lines 550 in the second horizontal openings.

At Step 650, the process flow includes forming a plurality of bit lines (e.g. 791, 792, FIG. 1A; 791-794, FIG. 7; 891, 892, FIG. 8) overlying the array of vertical channel lines (e.g. 761, 763, FIG. 1A; 761-764, FIG. 7; 861-864, FIG. 8) coupled to the vertical channel lines via upper ends of the vertical channel lines.

Steps shown in the example flow chart can be executed in order suitable for embodiments, rather than in order of steps shown in the example flow chart. For instance, in an embodiment illustrated in reference to FIGS. 3A through 3G, Step 640 can be executed before Step 620. In particular, layers of material used as charge storage structures can be formed (340, FIG. 3C) before vertical channel lines can be formed (350, FIG. 3E). In comparison, in an alternative embodiment illustrated in reference to FIGS. 5A through 5G, Step 620 can be executed before Step 640. In particular, vertical channel lines can be formed (550, FIG. 5D) before layers of material used as charge storage structures can be formed (540, FIG. 5F).

The process flow can also include forming an interlayer reference line contact (e.g. 375, FIG. 3G; 475, FIG. 4H; 575, FIG. 5G) disposed through the conductive lines in the plurality of stacks to the reference line, where lower ends of the vertical channel lines (e.g. 350, FIG. 3G; 450, FIG. 4H; 550, FIG. 5G) are connected for current flow to the reference line (e.g. 380, FIG. 3G; 480, FIG. 4H; 580, FIG. 5G), and the interlayer reference line contact is electrically coupled to the lower ends of the vertical channel lines via the reference line. An isolation structure (e.g. 377, FIG. 3G; 477, FIG. 4H; 577, FIG. 5G) is formed between an interlayer reference line contact (e.g. 575, FIG. 5G) and a stack of conductive lines including a select gate line (e.g. 510, FIG. 5G) and a word line (e.g. 520L, FIG. 5G).

Figure 7:
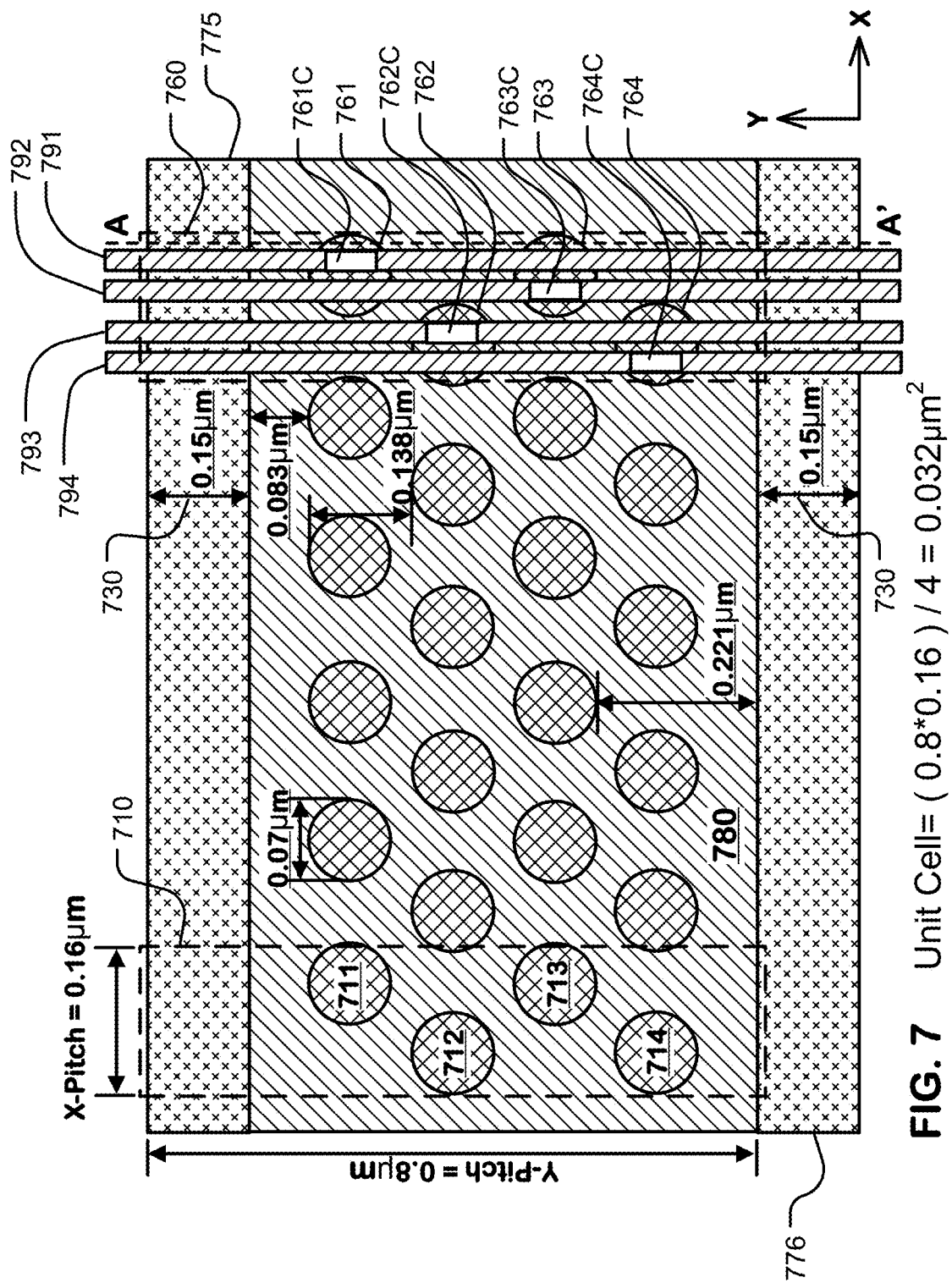
FIG. 7 is an example layout view of an array of two-transistor memory cells, two-transistor memory cells in the array including a vertical select transistor and a vertical data storage transistor, in accordance with an embodiment of the present technology.

FIG. 7 is an example layout view of an array of two-transistor memory cells, two-transistor memory cells in the array including a vertical select transistor and a vertical data storage transistor, in accordance with an embodiment of the present technology. This embodiment can be used to provide a set of cells where all cells in the set are accessible in parallel with selection by one select gate line coupled to the cells in the set.

The array includes a set of cells arranged in a number X of columns and a number Y of rows of cells. A select gate line 780 and a word line adjacent and beneath the select gate line each surround the cells in the set of cells. The plurality of bit lines (e.g. 791, 792, 793, 794) includes a number X times a number Y of bit lines coupled to respective vertical channel lines (e.g. 761, 762, 763, 764) of the cells in the set of cells. In this example, X=6 and Y=4, the set of cells includes 6×4=24 cells, and 6×4=24 bit lines each coupled to respective vertical channel lines of the cells in the set of cells.

The vertical channel lines (e.g. 711-714, 761-764) in the array of vertical channel lines as shown in FIG. 7 are disposed through a stack of conductive lines including the select gate line 780 and the word line adjacent and beneath the select gate line.

The stack of conductive lines is adjacent a first interlayer reference line contact 775 and a second interlayer reference line contact 776 opposite the first interlayer reference line contact 775. The first and second interlayer reference line contacts 775 and 776 have a width 730 of about 0.15 μm for example. The stack of conductive lines is electrically isolated from the first and second interlayer reference line contacts 775 and 776 by isolation structures (e.g. 135, 136, FIG. 1A) disposed between the stack of conductive lines and the first and second interlayer reference line contacts 775 and 776.

It is desirable to have smaller pitches in layout to help make smaller foot print of the array. In this example where Y=4, a one-column by Y-row area (e.g. 710) is arranged in one column and four rows of cells, and includes vertical channel lines (e.g. 711, 712, 713, 714) of four cells in the one-column by Y-row area 710. The one-column by Y-row area 710 has an X-pitch of about 0.16 μm and a Y-pitch of about 0.8 μm. The Y-pitch includes the separation width 730 of about 0.15 μm between adjacent stacks of conductive strips. The one-column by Y-row area 710 can have a size of X-pitch times Y-pitch (0.8 μm*0.16 μm), and a unit cell can have a cell size equal to one quarter of the size of the one-column by Y-row area. In this embodiment, the cell size of a unit cell can be about 0.8 μm*0.16 μm/4=0.032 μm². A vertical channel line of a cell can have a diameter of about 0.07 μm.

Cells in adjacent rows in a column are offset from each other in a row direction (e.g. X-direction). For instance, adjacent cells including vertical channel lines 711 and 712 are offset from each other, adjacent cells including vertical channel lines 712 and 713 are offset from each other, and adjacent cells including vertical channel lines 713 and 714 are offset from each other.

In this embodiment, a number Y of bit lines can be coupled to respective vertical channel lines of Y cells in a one-column by Y-row area (e.g. 760). In this example where Y=4, bit lines 791-794 are coupled to respective vertical channel lines 761-764 of cells in a one-column by Y-row area 760. The one-column by Y-row area 760 has the X-pitch and the Y-pitch as described herein in reference to the one-column by Y-row area 710. The bit lines 791-794 are coupled to respective vertical channel lines 761-764 of the cells in the one-column by Y-row area 760 via respective contacts (e.g. 761C, 762C, 763C, 764C).

Figure 8:
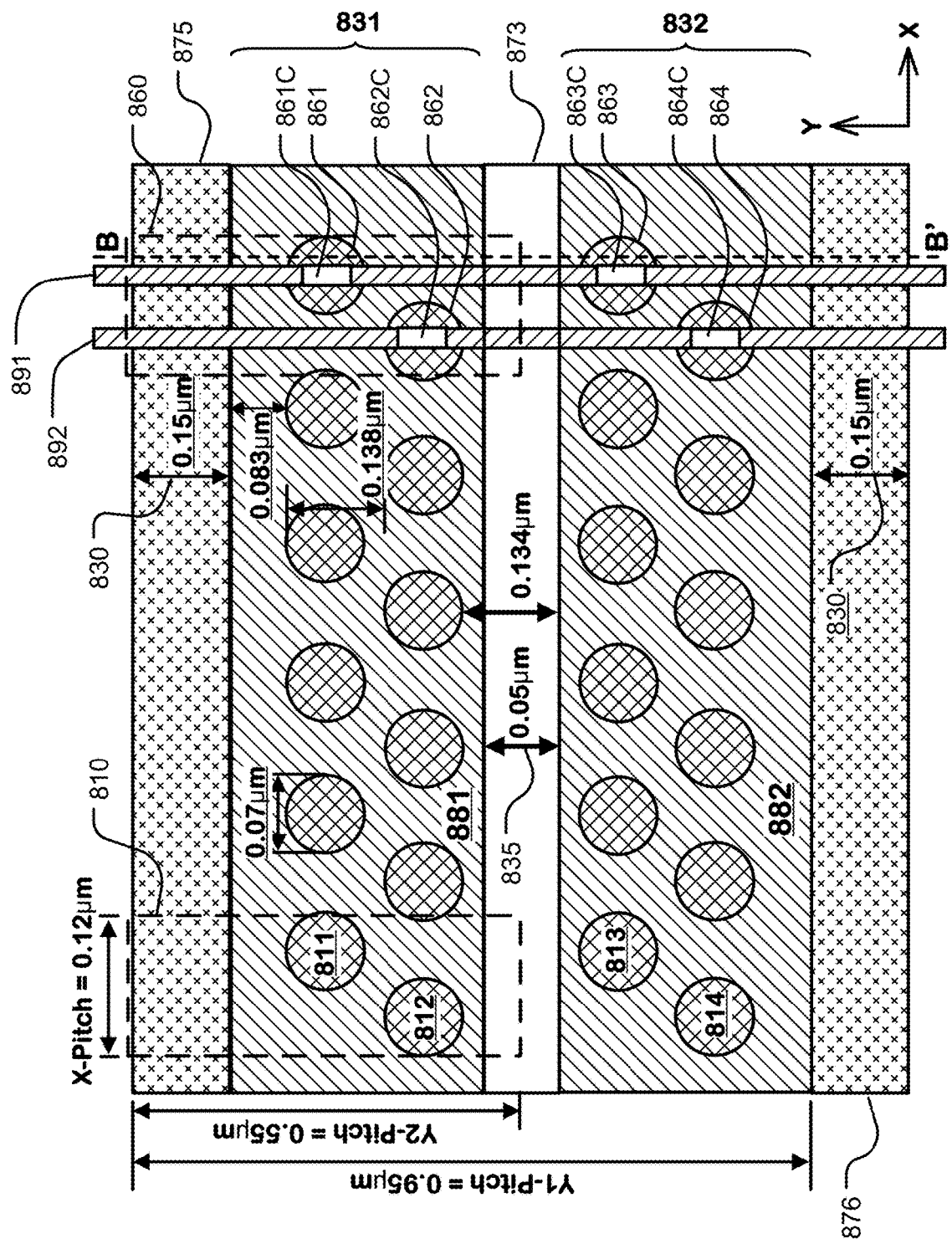
FIG. 8 is an alternative layout view of an array of two-transistor memory cells, two-transistor memory cells in the array including a vertical select transistor and a vertical data storage transistor, in accordance with an alternative embodiment of the present technology.

FIG. 8 is an alternative layout view of an array of two-transistor memory cells, two-transistor memory cells in the array including a vertical select transistor and a vertical data storage transistor, in accordance with an alternative embodiment of the present technology. This embodiment can be used to provide a set of cells having a first set of cells and a second set of cells. Cells in the first subset are accessible in parallel with selection by a first select gate line coupled to the cells in the first subset, and cells in the second subset are accessible in parallel with selection by a second select gate line coupled to the cells in the second subset.

The array includes a set of cells arranged in a number X of columns and a number Y of rows of cells. The set of cells has a first subset of cells 831 and a second subset of cells 832. The first and second subsets of cells are each arranged in the number X of columns and the number Y/2 of rows of cells. In this example, X=6, Y=4 and Y/2=2. The set of cells includes 6×4=24 cells, and each of the first and second subsets of cells includes 6×2=12 cells.

A first select gate line 881 and a first word line adjacent and beneath the first select gate line each surround the cells in the first subset of cells 831. A second select gate line 882 and a second word line adjacent and beneath the second select gate line each surround the cells in the second subsets of cells 832.

The plurality of bit lines (e.g. 891, 892) includes a number X times a number Y/2 of bit lines each coupled to a first vertical channel line of a first cell in the first subset of cells and a second vertical channel line of a second cell in the second subset of cells. In particular, a bit line 891 is coupled to a vertical channel line 861 of a cell in the first subset of cells 831, and is coupled to a vertical channel line 863 of a cell in the second subset of cells 832. A bit line 892 is coupled to a vertical channel line 862 of a cell in the first subset of cells 831, and is coupled to a vertical channel line 864 of a cell in the second subset of cells 832.

The vertical channel lines (e.g. 811-812, 861-862) in the first subset of cells 831 are disposed through a first stack of conductive lines including the first select gate line 881 and the first word line adjacent and beneath the first select gate line 881. The vertical channel lines (e.g. 813-814, 863-864) in the second subset of cells 832 are disposed through a second stack of conductive lines including the second select gate line 882 and the second word line adjacent and beneath the second select gate line 882.

The first stack of conductive lines is adjacent a first interlayer reference line contact 875 having a width 830 of about 0.15 μm for example. The first stack of conductive lines is electrically isolated from the first interlayer reference line contact 875 by an isolation structure (e.g. 137, FIG. 1B) disposed between the first stack of conductive lines and the first interlayer reference line contact 875. The second stack of conductive lines is adjacent a second interlayer reference line contact 876 having a width 830 of about 0.15 μm for example. The second stack of conductive lines is electrically isolated from the second interlayer reference line contact 876 by an isolation structure (e.g. 138, FIG. 1B) disposed between the second stack of conductive lines and the second interlayer reference line contact 876. The first stack of conductive lines is electrically isolated from the second stack of conductive lines by an isolation structure 873 having a width 835 of about 0.05 μm for example.

It is desirable to have smaller pitches in layout to help make smaller foot print of the array. In this example where Y/2=2, a one-column by Y/2-row area (e.g. 810) is arranged in one column and two rows of cells, and includes vertical channel lines (e.g. 811, 812) of two cells in the one-column by Y/2-row area 810. The one-column by Y/2-row area 810 has an X-pitch of about 0.12 μm and a Y2-pitch of about 0.55 μm. The Y2-pitch includes the separation width 830 of about 0.15 μm between adjacent pairs of first and second stacks of conductive strips. The one-column by Y/2-row area 810 can have a size of X-pitch times Y/2-pitch (0.55 μm*0.12 μm), and a unit cell can have a cell size equal to one half of the size of the one-column by Y/2-row area. In this embodiment, the cell size of a unit cell can be about 0.55 μm*0.12 μm/2=0.033 μm². A vertical channel line of a cell can have a diameter of about 0.07 μm.

Cells in adjacent rows in a column are offset from each other in a row direction (e.g. X-direction). For instance, adjacent cells including vertical channel lines 861 and 862 are offset from each other, adjacent cells including vertical channel lines 812 and 813 are offset from each other, and adjacent cells including vertical channel lines 863 and 864 are offset from each other.

In this embodiment, a number Y/2 of bit lines (e.g. 891, 892) can be each coupled to a vertical channel line of a first cell in the first subset of cells, and coupled to a vertical channel line of a second cell in the second subset of cells, where the first cell in the first subset of cells and the second cell in the second subset of cells are aligned in a direction along which the bit lines extend. In this example where Y=4, a bit line 891 is coupled to a vertical channel line 861 of a first cell in the first subset of cells 831 via a contact 861C, and coupled to a vertical channel line 863 of a second cell in the second subset of cells 832 via a contact 863C. Similarly, a bit line 892 is coupled to a vertical channel line 862 of a first cell in the first subset of cells 831 via a contact 862C, and coupled to a vertical channel line 864 of a second cell in the second subset of cells 832 via a contact 864C.

As can be seen in the table below, the cell size of a unit cell of the present technology as described in reference to FIGS. 7 and 8 is smaller than those of prior art. Lower bias conditions as shown in FIG. 10 are suitable for the smaller cell sizes of the present technology.

| Technology | | Cell Size |
|---|---|---|
| Low Cost Flash | 90 nm Flash | 0.5184 μm² |
| | 55 nm Flash | 0.2117 μm² |
| | eMemory 180 nm NeoFlash | 0.7452 μm² |
| High Performance Flash | SST 55 nm third generation | 0.0847~0.1663 μm² |
| | Split Gate 40 nm SONOS | 0.088 μm² |
| Present Technology | FIG. 7 | 0.032 μm² |
| | FIG. 8 | 0.033 μm² |

Figure 9:
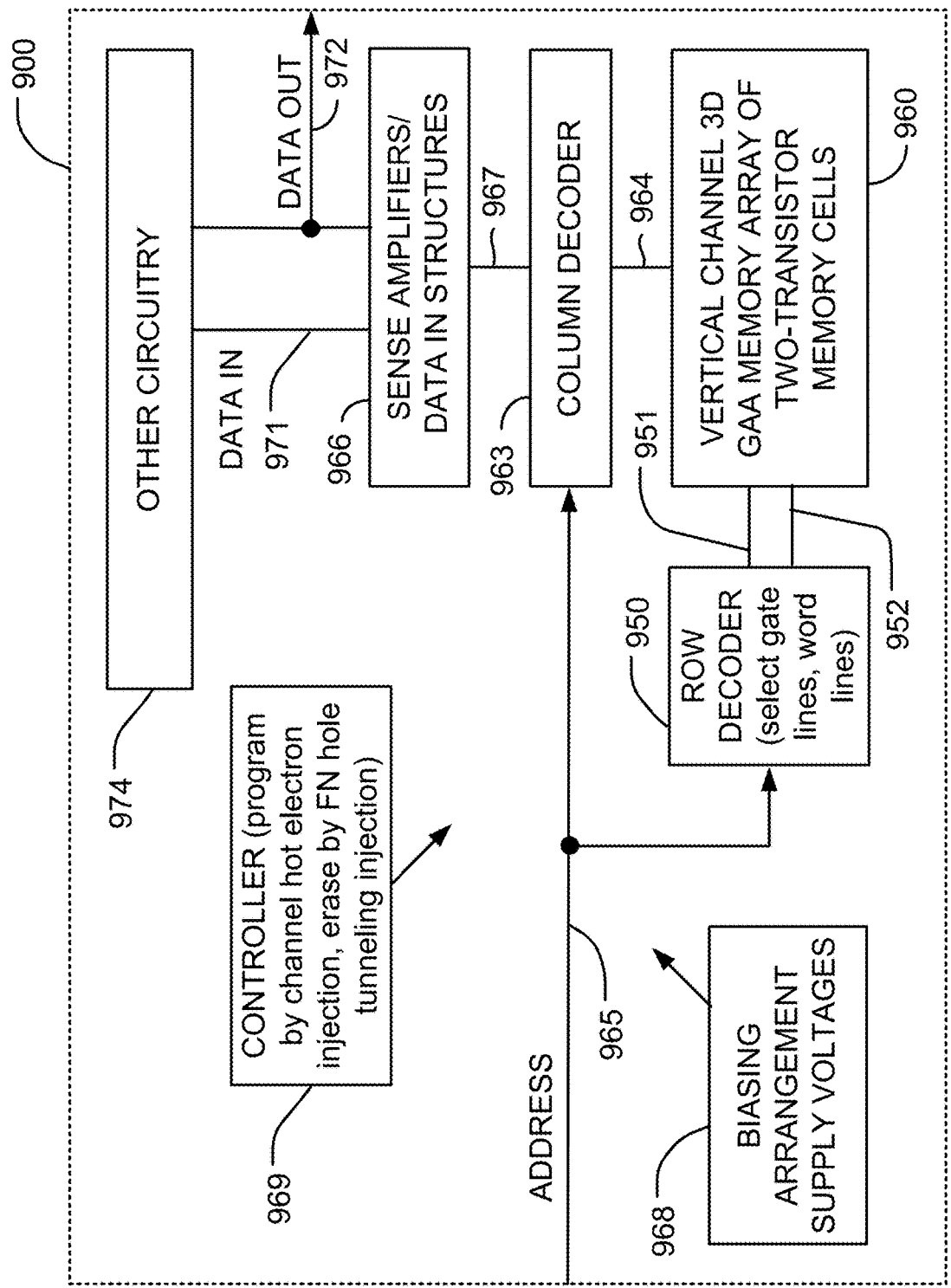
FIG. 9 is a simplified block diagram of an integrated circuit in accordance with the present technology.

FIG. 9 is a simplified block diagram of an integrated circuit in accordance with the present technology. In the example shown in FIG. 9, the integrated circuit 900 includes a vertical channel GAA (gate-all-around) array 960 of two-transistor memory cells, two-transistor memory cells in the array including a vertical select transistor and a vertical data storage transistor. The array of two-transistor memory cells comprises a plurality of stacks of conductive lines separated by insulating layers on a substrate, a stack of conductive lines in the plurality of stacks including a select gate line and a word line adjacent the select gate line.

The array 960 comprises an array of vertical channel lines disposed through the conductive lines in the plurality of stacks to a reference line, gate dielectric structures surrounding the vertical channel lines at channel regions of vertical select transistors in the array of vertical channel lines and the select gate lines, charge storage structures surrounding the vertical channel lines at channel regions of vertical data storage transistors in the array of vertical channel lines and the word lines, and a plurality of bit lines overlying the array of vertical channel lines coupled to the vertical channel lines via upper ends of the vertical channel lines.

A row decoder 950 is coupled to a plurality of select gate lines 951 and a plurality of word lines 952, and arranged along rows in the memory array 960. A column decoder 963 is coupled to a plurality of bit lines 964 arranged along columns in the memory array 960 for reading and programming data from the memory cells in the memory array 960. Addresses are supplied on bus 965 to column decoder 963 and row decoder 961. Sense amplifiers and data-in structures in block 966 are coupled to the column decoder 963 in this example via data bus 967. Data is supplied via the data-in line 971 from input/output ports on the integrated circuit 900 or from other data sources internal or external to the integrated circuit 900, to the data-in structures in block 966. In the illustrated embodiment, other circuitry 974 is included on the integrated circuit, such as a general purpose processor or special purpose application circuitry, or a combination of modules providing system-on-a-chip functionality supported by the programmable resistance cell array. Data is supplied via the data-out line 972 from the sense amplifiers in block 966 to input/output ports on the integrated circuit 900, or to other data destinations internal or external to the integrated circuit 900.

A controller 969 implemented in this example using bias arrangement state machine controls the application of bias arrangement supply voltage generated or provided through the voltage supply or supplies in block 968, such as read, program and erase voltages. Controller 969 can be configured to execute a program operation on memory cells in the array of two-transistor memory cells by using channel hot electron injection, and to execute an erase operation on memory cells in the array of two-transistor memory cells by using Fowler-Nordheim (FN) or band-to-band channel hot hole injection.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

FIG. 10 is a table illustrating example bias conditions for executing program, erase and read operations on two-transistor memory cells in accordance with the present technology. Two-transistor memory cells in the array of two-transistor memory cells include a vertical select transistor (e.g. 210, FIG. 2) and a vertical data storage transistor (e.g. 220, FIG. 2). "Select Gate Line" and "Word Line" as used in the table are illustrated in FIG. 2. "Drain" and "Source" as used in the table can be illustrated in FIG. 2 by a top region 251 acting as a first current conducting terminal of the vertical select transistor 210T and a bottom region 255 acting as a second current conducting terminal of the vertical data storage transistor 220T, respectively. For an erase operation in the table, "FN" refers to Fowler-Nordheim hole tunneling injection, and BTB refers to band-to-band hot hole injection.

Figure 11:
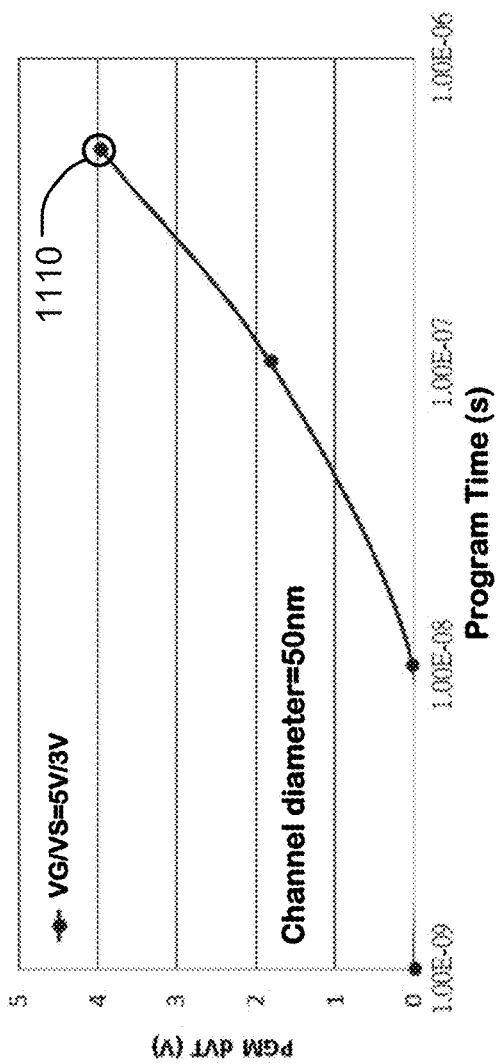
FIG. 11 illustrates simulation results of a program operation on two-transistor memory cells in accordance with the present technology.

FIG. 11 illustrates simulation results of a program operation on two-transistor memory cells in accordance with the present technology. A program operation can be executed by using channel hot electron injection. Parameters used in the simulations include a channel diameter 231 (FIG. 2) of about 50 nm for a vertical semiconductor pillar (e.g. 250, FIG. 2) through a select gate line (211, FIG. 2) and a word line (221, FIG. 2) in a two-transistor memory cell (e.g. 200, FIG. 2), a bias voltage (e.g. VG=5V) on the word line (e.g. 221, FIG. 2) coupled to the vertical data storage transistor (e.g. 220, FIG. 2), and a bias voltage (e.g. VS=3V) on a source of the vertical data storage transistor (e.g. 220, FIG. 2). In the example program operation shown in FIG. 11, a threshold voltage (dVT) of the vertical data storage transistor (e.g. 220, FIG. 2) reaches a program threshold voltage 1110 (e.g. 4V).

Figure 12:
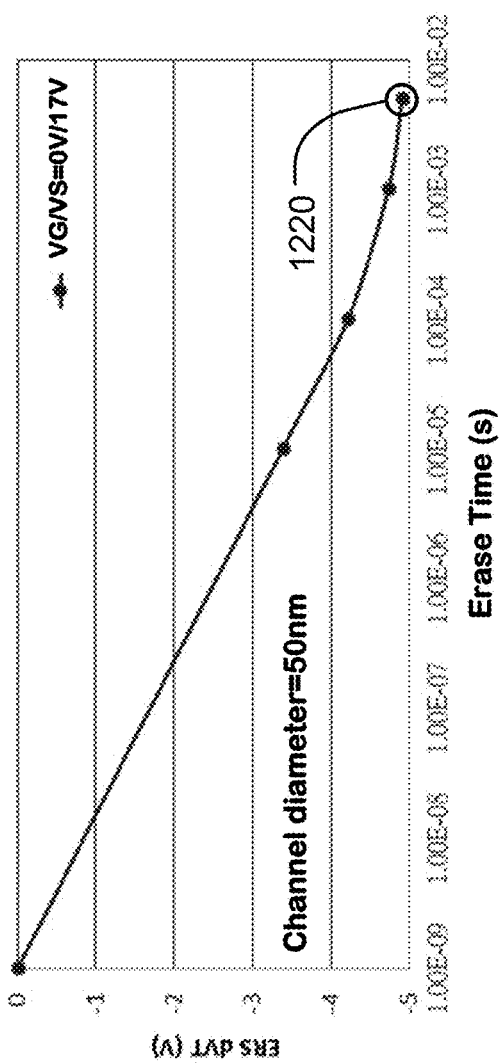
FIG. 12 illustrates simulation results of an erase operation on two-transistor memory cells in accordance with the present technology.

FIG. 12 illustrates simulation results of an erase operation on two-transistor memory cells in accordance with the present technology. An erase operation can be executed by using Fowler-Nordheim (FN) hole tunneling injection. Parameters used in the simulations include a channel diameter 231 (FIG. 2) of about 50 nm for a vertical semiconductor pillar (e.g. 250, FIG. 2) through a select gate line (211, FIG. 2) and a word line (221, FIG. 2) in a two-transistor memory cell (e.g. 200, FIG. 2), a bias voltage (e.g. VG=0V) on a word line (e.g. 221, FIG. 2) coupled to the vertical data storage transistor (e.g. 220, FIG. 2), and a bias voltage (e.g. VS=17V) on a source of the vertical data storage transistor (e.g. 220, FIG. 2). In the example erase operation shown in FIG. 12, a threshold voltage (dVT) of the vertical data storage transistor (e.g. 220, FIG. 2) reaches an erase threshold voltage 1220 (e.g. −5V).

Figure 13:
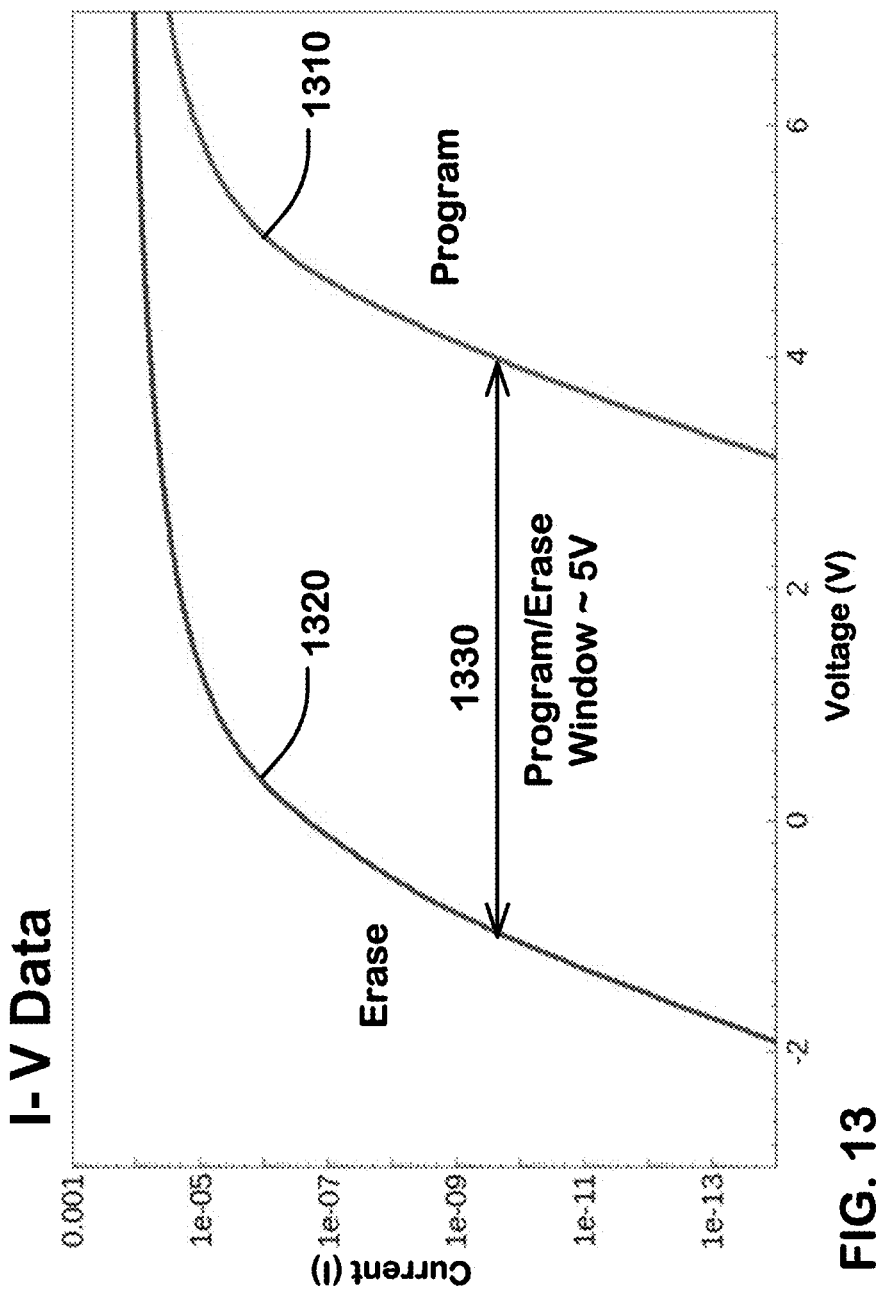
FIG. 13 illustrates I-V characteristics of program and erase operations on two-transistor memory cells in accordance with the present technology.

FIG. 13 illustrates I-V characteristics of program and erase operations on two-transistor memory cells in accordance with the present technology. FIG. 13 illustrates an I-V curve 1310 for a program operation and an I-V curve 1320 for an erase operation. FIG. 13 illustrates a program/erase window of about 5V between the I-V curve 1310 for a program operation and the I-V curve 1320 for an erase operation. The window shows a sufficient difference in I-V characteristics between a program operation and an erase operation on a vertical data storage transistor at low bias such as described in reference to FIG. 10.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an array of two-transistor memory cells, two-transistor memory cells in the array including a vertical select transistor and a vertical data storage transistor, the array of two-transistor memory cells comprising a plurality of stacks of conductive lines separated by insulating layers on a substrate, a stack of conductive lines in the plurality of stacks including a select gate line and a word line adjacent the select gate line;
an array of vertical channel lines disposed through the conductive lines in the plurality of stacks to a reference line;
gate dielectric structures surrounding the vertical channel lines at channel regions of vertical select transistors located at cross-points of the array of vertical channel lines and the select gate line;
charge storage structures surrounding the vertical channel lines at channel regions of vertical data storage transistors located at cross-points of the array of vertical channel lines and the word line; and
a plurality of bit lines overlying the array of vertical channel lines coupled to the vertical channel lines via upper ends of the vertical channel lines,
wherein one of the select gate line and the word line adjacent the select gate line is adjacent the reference line, and another of the select gate line and the word line adjacent the select gate line is adjacent a bit line in the plurality of bit lines.

2. The memory device of claim 1, wherein lower ends of the vertical channel lines are connected for current flow to the reference line, comprising:
a reference line contact disposed through the conductive lines to the reference line, the reference line contact electrically coupled via the reference line to the lower ends of the vertical channel lines.

3. The memory device of claim 1, wherein
the array includes a set of cells arranged in a number X of columns and a number Y of rows of cells;
the select gate line and the word line each surround the cells in the set of cells; and
the plurality of bit lines includes a number X times a number Y of bit lines coupled to respective vertical channel lines of the cells in the set of cells.

4. The memory device of claim 1, wherein
the array includes a set of cells arranged in a number X of columns and a number Y of rows of cells, the set of cells having a first subset of cells and a second subset of cells, the first and second subsets of cells each arranged in the number X of columns and the number Y/2 of rows of cells;
the first-mentioned select gate line and the first-mentioned word line each surround the cells in one of the first and second subsets of cells;
a second select gate line and a second word line each surround the cells in another of the first and second subsets of cells; and
the plurality of bit lines includes a number X times a number Y/2 of bit lines each coupled to a vertical channel line of a first cell in the first subset of cells and a vertical channel line of a second cell in the second subset of cells.

5. The memory device of claim 1, comprising a controller configured to execute a program operation on memory cells in the array of two-transistor memory cells by using channel hot electron injection, and to execute an erase operation on memory cells in the array of two-transistor memory cells by using band-to-band hot hole injection or Fowler-Nordheim hole tunneling injection.

6. A method of manufacturing a memory device, comprising:
forming an array of two-transistor memory cells, two-transistor memory cells in the array including a vertical select transistor and a vertical data storage transistor, including:
forming a plurality of stacks of conductive lines separated by insulating layers on a reference line on a substrate, a stack of conductive lines in the plurality of stacks including a select gate line and a word line adjacent the select gate line;
forming an array of vertical channel lines disposed through the conductive lines in the plurality of stacks to the reference line;
forming gate dielectric structures surrounding the vertical channel lines at channel regions of vertical select transistors located at cross-points of the array of vertical channel lines and the select gate line;
forming charge storage structures surrounding the vertical channel lines at channel regions of vertical data storage transistors located at cross-points of the array of vertical channel lines and the word line; and
forming a plurality of bit lines overlying the array of vertical channel lines coupled to the vertical channel lines via upper ends of the vertical channel lines,
wherein one of the select gate line and the word line adjacent the select gate line is adjacent the reference line, and another of the select gate line and the word line adjacent the select gate line is adjacent a bit line in the plurality of bit lines.

7. The method of claim 6, said forming the plurality of stacks of conductive lines comprising:
forming a plurality of stacks of sacrificial lines separated by insulating layers on the reference line on the substrate, a stack in the plurality of stacks of sacrificial lines including a first sacrificial line and a second sacrificial line adjacent the first sacrificial line; and
replacing the sacrificial lines in the plurality of stacks of sacrificial lines with a conductive material.

8. The method of claim 7, said forming the array of vertical channel lines comprising:
forming an array of holes through the sacrificial lines in the plurality of stacks of sacrificial lines; and
forming vertical channel lines in the array of vertical channel lines in the holes in the array of holes, before said replacing the sacrificial lines.

9. The method of claim 7, said forming the gate dielectric structures comprising:
removing the first sacrificial line to form first horizontal openings between the insulating layers; and
forming the gate dielectric structures on side surfaces of the vertical channel lines in the first horizontal openings.

10. The method of claim 7, said forming the charge storage structures comprising:
forming an array of holes through the sacrificial lines in the plurality of stacks of sacrificial lines;

forming layers of material used as the charge storage structures disposed on side surfaces of the first sacrificial line and the second sacrificial line in holes in the array of holes; and removing the layers of material on the side surfaces of the first sacrificial line in holes in the array of holes, before said replacing the sacrificial lines.

11. The method of claim 6, said forming the plurality of stacks of conductive lines comprising:

forming a plurality of stacks of conductive lines and sacrificial lines separated by insulating layers on a reference line on the substrate, a stack in the plurality of stacks of conductive lines and sacrificial lines including a first conductive line and a second sacrificial line adjacent the first conductive line; and replacing the second sacrificial lines in the plurality of stacks of conductive lines and sacrificial lines with a conductive material.

12. The method of claim 11, said forming the array of vertical channel lines comprising:

forming an array of holes through the conductive lines and the sacrificial lines in the plurality of stacks of conductive lines and sacrificial lines to the reference line; and forming vertical channel lines in the array of vertical channel lines in the holes in the array of holes, before said replacing the second sacrificial lines.

13. The method of claim 11, said forming the gate dielectric structures comprising:

forming an array of holes through the conductive lines and sacrificial lines in the plurality of stacks of conductive lines and sacrificial lines; and forming the gate dielectric structures on side surfaces of the first conductive line and the second sacrificial line in the holes in the array of holes.

14. The method of claim 11, said forming the charge storage structures comprising:

removing the second sacrificial line to form second horizontal openings between the insulating layers; and forming layers of material used as the charge storage structures on side surfaces of the vertical channel lines in the second horizontal openings.

15. The method of claim 6, said forming the charge storage structures comprising:

forming an array of holes through the conductive lines in the plurality of stacks of conductive lines;

forming layers of material used as the charge storage structures disposed on side surfaces of the select gate lines and the word lines in the stacks of conductive lines in holes in the array of holes;

removing the layers of material on the side surfaces of the select gate lines in holes in the array of holes; and forming the gate dielectric structures on the layers of material used as the charge storage structures disposed on the side surfaces of the word lines.

16. The method of claim 15, said forming the gate dielectric structures comprising:

forming the gate dielectric structures on the side surfaces of the select gate lines in the plurality of stacks of conductive lines in holes in the array of holes, after said removing the layers of material on the side surfaces of the select gate lines.

17. The method of claim 6, wherein lower ends of the vertical channel lines are connected for current flow to the reference line, comprising:

forming a reference line contact disposed through the conductive lines in the plurality of stacks to the reference line, the reference line contact electrically coupled to the lower ends of the vertical channel lines via the reference line.

18. The method of claim 6, wherein the array includes a set of cells arranged in a number X of columns and a number Y of rows of cells;

the select gate line and the word line each surround the cells in the set of cells; and the plurality of bit lines includes a number X times a number Y of bit lines coupled to respective vertical channel lines of the cells in the set of cells.

19. The method of claim 6, wherein the array includes a set of cells arranged in a number X of columns and a number Y of rows of cells, the set of cells having a first subset of cells and a second subset of cells, the first and second subsets of cells each arranged in the number X of columns and the number Y/2 of rows of cells;

the first-mentioned select gate line and the first-mentioned word line each surround the cells in one of the first and second subsets of cells;

a second select gate line and a second word line each surround the cells in another of the first and second subsets of cells; and the plurality of bit lines includes a number X times a number Y/2 of bit lines each coupled to a vertical channel line of a first cell in the first subset of cells and a vertical channel line of a second cell in the second subset of cells.

20. A memory device, comprising:

a two-transistor memory cell including a vertical select transistor having a first channel region in a vertical semiconductor pillar and a vertical data storage transistor having a second channel region in the vertical semiconductor pillar;

the vertical semiconductor pillar having a top region) above the first channel region acting as a first current conducting terminal of the vertical select transistor, a bottom region below the second channel region acting as a second current conducting terminal of the vertical data storage transistor, and an intermediate region between the first channel region and the second channel region acting as a second current conducting terminal of the vertical select transistor and a first current conducting terminal of the vertical data storage transistor;

a bit line coupled to the top region of the vertical semiconductor pillar; and a reference line coupled to the bottom region of the vertical semiconductor pillar;

a select gate line surrounding the first channel region in the vertical semiconductor pillar;

a gate dielectric structure disposed between the select gate line and the first channel region in the vertical semiconductor pillar;

a word line surrounding the second channel region in the vertical semiconductor pillar; and a charge storage structure disposed between the word line and the second channel region in the vertical semiconductor pillar, wherein the word line is adjacent the select gate line, and one of the select gate line and the word line adjacent the select gate line is adjacent the reference line, and another of the select gate line and the word line adjacent the select gate line is adjacent the bit line.

* * * * *